United States Patent
Cheng et al.

(10) Patent No.: US 11,302,700 B2
(45) Date of Patent: Apr. 12, 2022

(54) BONDED SEMICONDUCTOR DEVICES HAVING PROGRAMMABLE LOGIC DEVICE AND NAND FLASH MEMORY AND METHODS FOR FORMING THE SAME

(71) Applicant: YANGTZE MEMORY TECHNOLOGIES CO., LTD., Wuhan (CN)

(72) Inventors: Weihua Cheng, Wuhan (CN); Jun Liu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 16/727,893

(22) Filed: Dec. 26, 2019

(65) Prior Publication Data
US 2020/0350321 A1 Nov. 5, 2020

Related U.S. Application Data

(63) Continuation of application No. PCT/CN2019/110976, filed on Oct. 14, 2019.

(30) Foreign Application Priority Data

Apr. 30, 2019 (WO) ............... PCT/CN2019/085237
Jul. 24, 2019 (WO) ............... PCT/CN2019/097442
Sep. 11, 2019 (WO) ............... PCT/CN2019/105291

(51) Int. Cl.
*H01L 27/11* (2006.01)
*H01L 21/76* (2006.01)
*H01L 23/00* (2006.01)

(52) U.S. Cl.
CPC .......... *H01L 27/1104* (2013.01); *H01L 21/76* (2013.01); *H01L 24/29* (2013.01);
(Continued)

(58) Field of Classification Search
CPC ............... H01L 27/11; H01L 27/11524; H01L 25/0657; H01L 27/11551; H01L 2225/06513
See application file for complete search history.

(56) References Cited

U.S. PATENT DOCUMENTS 8,378,715 B2    2/2013   Or-Bach et al.
2009/0026524 A1*   1/2009   Kreupl ................ H01L 25/0657
                                                                             257/316

(Continued)

FOREIGN PATENT DOCUMENTS

CN        1339160 A      3/2002
CN        1551332 A     12/2004
(Continued)

OTHER PUBLICATIONS

International Search Report issued in corresponding International Application No. PCT/2019/110976, dated Jan. 23, 2020, 4 pages.
(Continued)

*Primary Examiner* — Julio J Maldonado
*Assistant Examiner* — Stanetta D Isaac
(74) *Attorney, Agent, or Firm* — Bayes PLLC

(57) ABSTRACT

Embodiments of semiconductor devices and fabrication methods thereof are disclosed. In an example, a semiconductor device includes a first semiconductor structure including a programmable logic device, an array of static random-access memory (SRAM) cells, and a first bonding layer including a plurality of first bonding contacts. The semiconductor device also includes a second semiconductor structure including an array of NAND memory cells and a second bonding layer including a plurality of second bonding contacts. The semiconductor device further includes a bonding interface between the first bonding layer and the second bonding layer. The first bonding contacts are in
(Continued)

contact with the second bonding contacts at the bonding interface.

20 Claims, 23 Drawing Sheets

(52) U.S. Cl.
CPC .............. *H01L 24/83* (2013.01); *H01L 24/94* (2013.01); *H01L 2224/291* (2013.01)

(56) References Cited

U.S. PATENT DOCUMENTS

| | | |
|---|---|---|
| 2013/0141858 A1 | 6/2013 | Pyeon |
| 2013/0277749 A1 | 10/2013 | Kura et al. |
| 2015/0021789 A1 | 1/2015 | Lin |
| 2015/0179285 A1 | 6/2015 | Kilmer et al. |
| 2019/0043836 A1 | 2/2019 | Fastow et al. |
| 2019/0123024 A1 | 4/2019 | Teig et al. |
| 2019/0363079 A1 | 11/2019 | Thei et al. |

FOREIGN PATENT DOCUMENTS

| | | |
|---|---|---|
| CN | 101465346 A | 6/2009 |
| CN | 105097019 A | 11/2015 |
| CN | 105390501 A | 3/2016 |
| CN | 105468569 A | 4/2016 |
| CN | 107658315 A | 2/2018 |
| CN | 109148498 A | 1/2019 |
| CN | 109155301 A | 1/2019 |
| CN | 109496349 A | 3/2019 |
| CN | 109643700 A | 4/2019 |
| CN | 110249427 A | 9/2019 |
| CN | 110291631 A | 9/2019 |
| TW | 200824069 A | 6/2008 |
| TW | 201338158 A | 9/2013 |
| TW | 201401512 A | 1/2014 |
| TW | 201511237 A | 3/2015 |
| TW | 201608697 A | 3/2016 |
| TW | 201813008 A | 4/2018 |
| TW | 201913975 A | 4/2019 |
| TW | 201915624 A | 4/2019 |

OTHER PUBLICATIONS

Written Opinion of the International Searching Authority issued in corresponding International Application No. PCT/2019/110976, dated Jan. 23, 2020, 4 pages.
International Search Report issued in corresponding International Application No. PCT/2019/110977, dated Jan. 21, 2020, 4 pages.
Written Opinion of the International Searching Authority issued in corresponding International Application No. PCT/2019/110977, dated Jan. 21, 2020, 5 pages.

* cited by examiner

100

101

300

301

BONDED SEMICONDUCTOR DEVICES HAVING PROGRAMMABLE LOGIC DEVICE AND NAND FLASH MEMORY AND METHODS FOR FORMING THE SAME

CROSS-REFERENCE TO RELATED APPLICATIONS

This application is a continuation of International Application No. PCT/CN2019/110976, filed on Oct. 14, 2019, entitled "BONDED SEMICONDUCTOR DEVICES HAVING PROGRAMMABLE LOGIC DEVICE AND NAND FLASH MEMORY AND METHODS FOR FORMING THE SAME," which claims the benefit of priorities to International Application No. PCT/CN2019/105291, filed on Sep. 11, 2019, entitled "BONDED SEMICONDUCTOR DEVICES HAVING PROCESSOR AND NAND FLASH MEMORY AND METHODS FOR FORMING THE SAME," International Application No. PCT/CN2019/097442, filed on Jul. 24, 2019, entitled "BONDED UNIFIED SEMICONDUCTOR CHIPS AND FABRICATION AND OPERATION METHODS THEREOF," and International Application No. PCT/CN2019/085237, filed on Apr. 30, 2019, entitled "THREE-DIMENSIONAL MEMORY DEVICE WITH EMBEDDED DYNAMIC RANDOM-ACCESS MEMORY," all of which are incorporated herein by reference in their entireties. This application is also related to U.S. application Ser. No. 16/727,893, filed on Dec. 26, 2019, entitled "BONDED SEMICONDUCTOR DEVICES HAVING PROGRAMMABLE LOGIC DEVICE AND DYNAMIC RANDOM-ACCESS MEMORY AND METHODS FOR FORMING THE SAME," which is hereby incorporated by reference in its entirety.

BACKGROUND

Embodiments of the present disclosure relate to semiconductor devices and fabrication methods thereof.

Field-programmable gate arrays (FPGAs) are reprogrammable integrated circuits that contain an array of programmable logic blocks. FPGA chip adoption is driven by their flexibility, hardware-timed speed and reliability, and parallelism. FPGAs provide benefits to designers of many types of electronic equipment, ranging from smart energy grids, aircraft navigation, automotive driver's assistance, medical ultrasounds, and data center search engines. Today, FPGAs are gaining prominence in another field as well: deep neural networks (DNNs) that are used for artificial intelligence (AI), such as in analyzing large amounts of data for machine learning.

SUMMARY

Embodiments of semiconductor devices and fabrication methods thereof are disclosed herein.

In one example, a semiconductor device includes a first semiconductor structure including a programmable logic device, an array of static random-access memory (SRAM) cells, and a first bonding layer including a plurality of first bonding contacts. The semiconductor device also includes a second semiconductor structure including an array of NAND memory cells and a second bonding layer including a plurality of second bonding contacts. The semiconductor device further includes a bonding interface between the first bonding layer and the second bonding layer. The first bonding contacts are in contact with the second bonding contacts at the bonding interface.

In another example, a method for forming a semiconductor device is disclosed. A plurality of first semiconductor structures are formed on a first wafer. At least one of the first semiconductor structures includes a programmable logic device, an array of SRAM cells, and a first bonding layer including a plurality of first bonding contacts. A plurality of second semiconductor structures are formed on a second wafer. At least one of the second semiconductor structures includes an array of NAND memory cells and a second bonding layer including a plurality of second bonding contacts. The first wafer and the second wafer are bonded in a face-to-face manner, such that the at least one of the first semiconductor structures is bonded to the at least one of the second semiconductor structures. The first bonding contacts of the first semiconductor structure are in contact with the second bonding contacts of the second semiconductor structure at a bonding interface. The bonded first and second wafers are diced into a plurality of dies. At least one of the dies includes the bonded first and second semiconductor structures.

In still another example, a method for forming a semiconductor device is disclosed. A plurality of first semiconductor structures are formed on a first wafer. At least one of the first semiconductor structures includes a programmable logic device, an array of SRAM cells, and a first bonding layer including a plurality of first bonding contacts. The first wafer is diced into a plurality of first dies, such that at least one of the first dies includes the at least one of the first semiconductor structures. A plurality of second semiconductor structures are formed on a second wafer. At least one of the second semiconductor structures includes an array of NAND memory cells and a second bonding layer including a plurality of second bonding contacts. The second wafer is diced into a plurality of second dies, such that at least one of the second dies includes the at least one of the second semiconductor structures. The first die and the second die are bonded in a face-to-face manner, such that the first semiconductor structure is bonded to the second semiconductor structure. The first bonding contacts of the first semiconductor structure are in contact with the second bonding contacts of the second semiconductor structure at a bonding interface.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
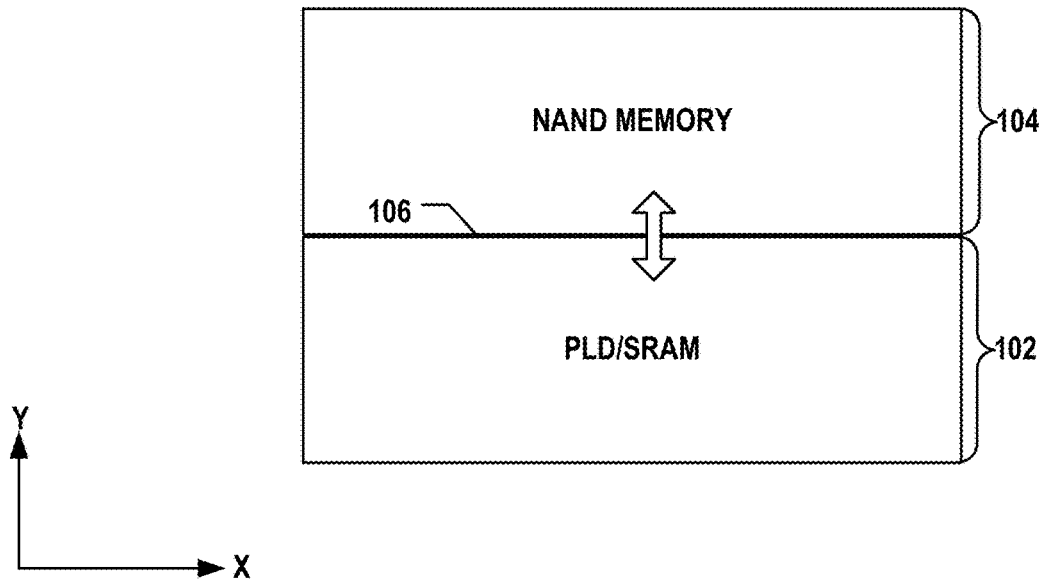
FIG. 1A illustrates a schematic view of a cross-section of an exemplary semiconductor device, according to some embodiments.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiments. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, a "wafer" is a piece of a semiconductor material for semiconductor devices to build in and/or on it and that can undergo various fabrication processes before being separated into dies.

Conventional method for using embedded NAND memory (also known as "NAND flash memory") products as non-volatile memory/storage, such as embedded multimedia card (eMMC), universal flash storage (UFS), and ball grid array (BGA) solid-state drive (SSD), etc. is that the NAND memory chips are soldered onto the printed circuit board (PCB). Control lines and data transfer lines of the corresponding protocols of all memory devices are derived from the host (e.g., CPU, FPGA, etc.). The conventional method, however, can introduce cross-talk between the control and data transfer lines and cause high loading on the host.

On the other hand, the application of programmable logic devices (PLDs), in particular, FPGAs, is limited to their cost and working frequency. The relatively large chip area consumption of FPGA chips causes high cost, and the signal transfer delay, such as the resistive-capacitive (RC) delay from metal routing, limits the working frequency.

Various embodiments in accordance with the present disclosure provide a semiconductor device with a programmable logic device core, cache, and non-volatile memory integrated on a bonded chip to achieve higher working frequency, wider data bandwidth, lower power consumption, and lower cost. The semiconductor device disclosed herein can include a first semiconductor structure having a programmable logic device core and SRAM (e.g., as cache) and a second semiconductor structure having NAND memory (e.g., as non-volatile memory) bonded to the first semiconductor structure with a large number of short-distanced vertical metal interconnects instead of the peripherally-distributed, long-distanced metal routing, or even conventional through silicon vias (TSVs). In some embodiments, the programmable logic device core includes a large number of programmable logic blocks to increase the efficiency of the chip area utilization, thereby reducing the cost.

As a result, shorter manufacturing cycle time with higher yield can be achieved due to less interactive influences from manufacturing programmable logic device of the programmable logic device wafer and the NAND memory wafer as well as the known good hybrid bonding yield. The shorter connection distance between the programmable logic device and NAND memory, such as from millimeter or centimeter-level to micrometer-level, can improve the device performance with faster data transfer rate, improve programmable logic device core logic efficiency with wider bandwidth, and improve system speed.

FIG. 1A illustrates a schematic view of a cross-section of an exemplary semiconductor device 100, according to some embodiments. Semiconductor device 100 represents an example of a bonded chip. The components of semiconductor device 100 (e.g., PLD/SRAM and NAND memory) can be formed separately on different substrates and then jointed to form a bonded chip. Semiconductor device 100 can include a first semiconductor structure 102 including a programmable logic device and an array of SRAM cells. In some embodiments, the programmable logic device and SRAM cell array in first semiconductor structure 102 use complementary metal-oxide-semiconductor (CMOS) technology. Both the programmable logic device and the SRAM cell array can be implemented with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.) to achieve high speed.

A programmable logic device is an electronic component used to build reconfigurable digital circuits, which has an undefined function at the time of manufacture and is programmed (reconfigured) by using a program after the manufacturing. The programmable logic device can include, for example, programmable logic array (PLA), programmable array logic (PAL), generic array logic (GAL), complex programmable logic device (CPLD), and FPGA.

FPGA is an integrated circuit that can be configured by a customer or a designer after manufacturing, i.e., "field-programmable," using a hardware description language (HDL). FPGAs include an array of programmable logic blocks and a hierarchy of reconfigurable interconnects that allow the programmable logic blocks to be connected in different configurations to implement different logic functions, according to some embodiments. The programmable logic blocks, also known as configurable logic blocks (CLBs), slices, or logic cells, are the basic logic unit of an FPGA, can be made up of two basic components: flip-flops and lookup tables (LUTs). Some FPGAs further include fixed-function logic blocks (e.g., multipliers), memory (e.g., embedded RAM), and input/output (I/O) blocks.

Unlike processors, FPGAs are truly parallel in nature, so different processing operations do not have to compete for the same resources, according to some embodiments. Each independent processing task can be assigned to a dedicated section of the FPGA and can function autonomously without any influence from other logic blocks. As a result, the performance of one part of the application is not affected when adding more processing, according to some embodiments. In some embodiments. another benefit of FPGAs over processor-based systems is that the application logic is implemented in hardware circuits rather than executing on top of an operating system (OS), drivers, and application software.

Other processing units (also known as "logic circuits") besides the programmable logic device can be formed in first semiconductor structure 102 as well, such as the entirety or part of the peripheral circuits of the NAND memory of a second semiconductor structure 104. The peripheral circuit (also known as control and sensing circuits) can include any suitable digital, analog, and/or mixed-signal circuits used for facilitating the operations of the NAND memory. For example, the peripheral circuit can include one or more of a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors).

The SRAM is integrated on the same substrate of the logic circuits (e.g., the programmable logic device and peripheral circuits), allowing wider bus and higher operation speed, which is also known as "on-die SRAM." The memory controller of the SRAM can be embedded as part of the peripheral circuits. In some embodiments, each SRAM cell includes a plurality of transistors for storing a bit of data as a positive or negative electrical charge as well as one or more transistors that control access to it. In one example, each SRAM cell has six transistors (e.g., metal-oxide-semiconductor field-effect transistors (MOSFETs)), for example, four transistors for storing a bit of data and two transistors for controlling access to the data. The SRAM cells can locate in the area that is not occupied by the logic circuits (e.g., the programmable logic device and peripheral circuits) and thus, do not need extra space to be formed. The on-die SRAM can enable high-speed operations of semiconductor device 100, used as one or more caches (e.g., instruction cache or data cache) and/or data buffers. In some embodiments, the SRAM is used for storing data sets or passing values between parallel tasks. In some embodiments, the SRAM is be used to support reprogramming of the programmable logic device, such as partial reconfiguration (PR) of an FPGA, which dynamically reconfigures a portion of the FPGA while the remaining FPGA design continues to function.

Semiconductor device 100 can also include second semiconductor structure 104 including an array of NAND memory cells. That is, second semiconductor structure 104 can be a NAND flash memory device in which memory cells are provided in the form of an array of 3D NAND memory strings and/or an array of two-dimensional (2D) NAND memory cells. NAND memory cells can be organized into pages that are then organized into blocks in which each NAND memory cell is electrically connected to a separate line called a bit line (BL). All cells with the same vertical position in the NAND memory cell can be electrically connected through the control gates by a word line (WL). In some embodiments, a plane contains a certain number of blocks that are electrically connected through the same bit line. Second semiconductor structure 104 can include one or more planes, and the peripheral circuits that are needed to perform all the read/write/erase operations can be included in first semiconductor structure 102 and/or second semiconductor structure 104.

In some embodiments, the array of NAND memory cells are an array of 2D NAND memory cells, each of which includes a floating-gate transistor. The array of 2D NAND memory cells includes a plurality of 2D NAND memory strings, each of which includes a plurality of memory cells (e.g., 32 to 128 memory cells) connected in series (resembling a NAND gate) and two select transistors, according to some embodiments. Each 2D NAND memory string is arranged in the same plane on the substrate (in 2D), according to some embodiments. In some embodiments, the array of NAND memory cells are an array of 3D NAND memory strings, each of which extends vertically above the substrate (in 3D) through a memory stack. Depending on the 3D NAND technology (e.g., the number of layers/tiers in the memory stack), a 3D NAND memory string typically includes 32 to 256 NAND memory cells, each of which includes a floating-gate transistor or a charge-trap transistor.

As shown in FIG. 1A, semiconductor device 100 further includes a bonding interface 106 vertically between first semiconductor structure 102 and second semiconductor structure 104. As described below in detail, first and second semiconductor structures 102 and 104 can be fabricated separately (and in parallel in some embodiments) such that the thermal budget of fabricating one of first and second semiconductor structures 102 and 104 does not limit the processes of fabricating another one of first and second semiconductor structures 102 and 104. Moreover, a large number of interconnects (e.g., bonding contacts) can be formed through bonding interface 106 to make direct, short-distance (e.g., micron-level) electrical connections between first semiconductor structure 102 and second semiconductor structure 104, as opposed to the long-distance (e.g., millimeter or centimeter-level) chip-to-chip data bus on the circuit board, such as PCB, thereby eliminating chip interface delay and achieving high-speed I/O throughput with reduced power consumption. Data transfer between the NAND memory in second semiconductor structure 104 and the programmable logic device in first semiconductor structure 102 as well as between the NAND memory in second semiconductor structure 104 and the SRAM in first semiconductor structure 102 can be performed through the interconnects (e.g., bonding contacts) across bonding interface 106. By vertically integrating first and second semiconductor structures 102 and 104, the chip size can be reduced, and the memory cell density can be increased.

Figure 1B:
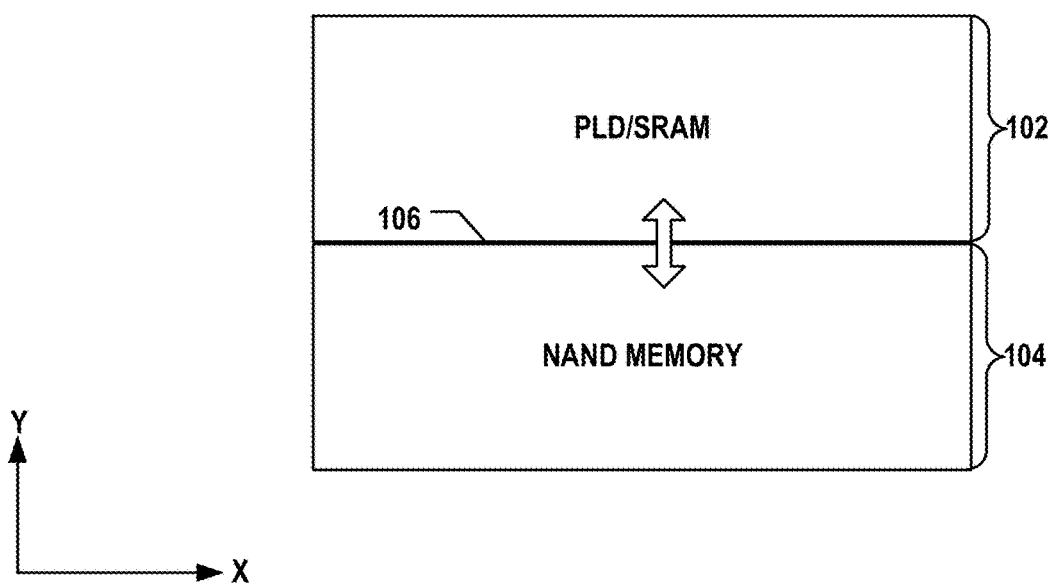
FIG. 1B illustrates a schematic view of a cross-section of another exemplary semiconductor device, according to some embodiments.

It is understood that the relative positions of stacked first and second semiconductor structures 102 and 104 are not limited. FIG. 1B illustrates a schematic view of a cross-section of another exemplary semiconductor device 101, according to some embodiments. Being different from semiconductor device 100 in FIG. 1A in which second semiconductor structure 104 including the array of NAND memory cells is above first semiconductor structure 102 including the programmable logic device and the array of SRAM cells, in semiconductor device 101 in FIG. 1B, first semiconductor structure 102 including the programmable logic device and the array of SRAM cells is above second semiconductor structure 104 including the array of NAND memory cells. Nevertheless, bonding interface 106 is formed vertically between first and second semiconductor structures 102 and 104 in semiconductor device 101, and first and second semiconductor structures 102 and 104 are joined vertically through bonding (e.g., hybrid bonding) according to some embodiments. Data transfer between the NAND memory in second semiconductor structure 104 and the programmable logic device in first semiconductor structure 102 as well as the data transfer between the NAND memory in second semiconductor structure 104 and the SRAM in first semiconductor structure 102 can be performed through the interconnects (e.g., bonding contacts) across bonding interface 106.

Figure 2A:
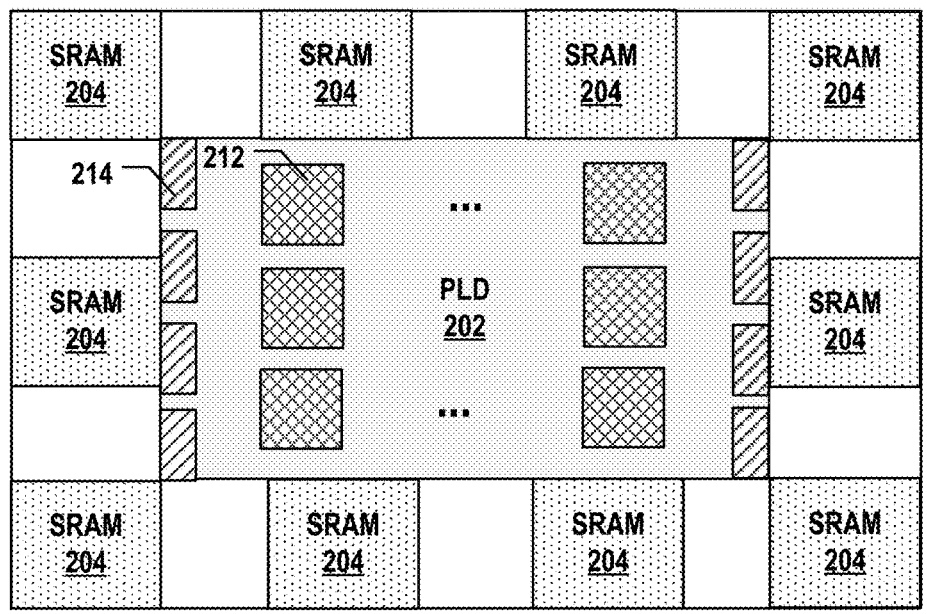
FIG. 2A illustrates a schematic plan view of an exemplary semiconductor structure having a programmable logic device and SRAM, according to some embodiments.

FIG. 2A illustrates a schematic plan view of an exemplary semiconductor structure 200 having a programmable logic device and SRAM, according to some embodiments. Semiconductor structure 200 may be one example of first semiconductor structure 102. Semiconductor structure 200 can include a programmable logic device (PLD) 202 on the same substrate as SRAM 204 and fabricated using the same logic process as SRAM 204. PLD 202 can include one or more of PLAs, PALs, GALs, CPLDs, FPGAs, to name a few. PLD 202 includes one or more of FPGA cores, each of which includes a plurality of programmable logic blocks 212 arranged in an array, according to some embodiments. For example, each programmable logic blocks 212 may include one or more LUTs. One or more programmable logic blocks 212 can be configured to perform an independent processing task. In some embodiments, PLD 202 further includes I/O blocks 214.

SRAM 204 can be disposed outside of PLD 202. For example, FIG. 2A shows an exemplary layout of SRAM 204 in which the array of SRAM cells are distributed in a plurality of separate regions in semiconductor structure 200, which is outside of PLD 202. That is, the memory module formed by SRAM 204 can be divided into smaller memory regions, distributing outside of PLD 202 in semiconductor structure 200. In one example, the distribution of the memory regions may be based on the design of the bonding contacts, e.g., occupying the areas without bonding contacts. In another example, the distribution of the memory regions may be random. As a result, more internal memory (e.g., using on-die SRAM) can be arranged surrounding PLD 202 without occupying additional chip area.

Figure 2B:
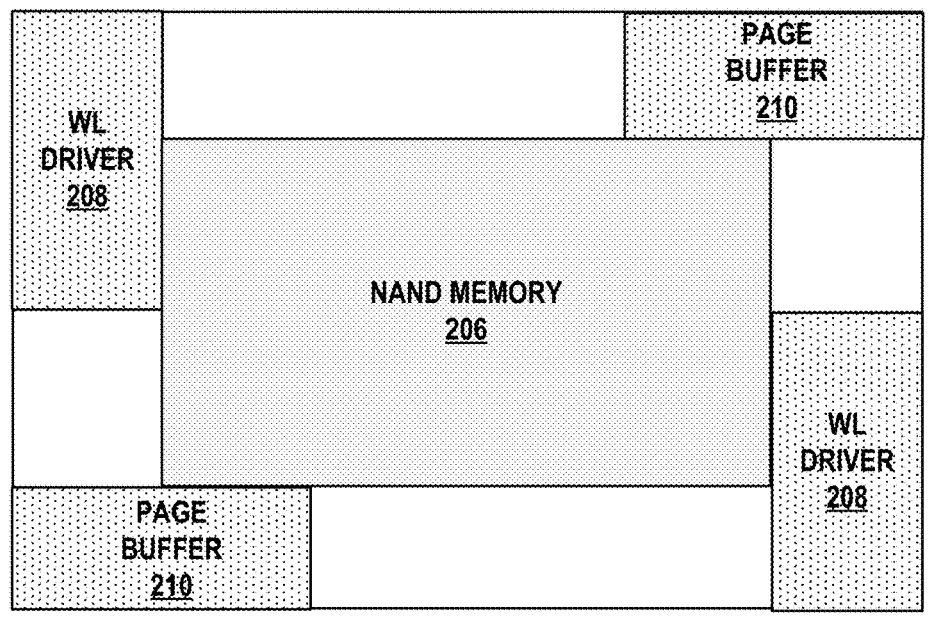
FIG. 2B illustrates a schematic plan view of an exemplary semiconductor structure having NAND memory and peripheral circuits, according to some embodiments.

FIG. 2B illustrates a schematic plan view of an exemplary semiconductor structure 201 having NAND memory and peripheral circuits, according to some embodiments. Semiconductor structure 201 may be one example of second semiconductor structure 104. Semiconductor structure 201 can include NAND memory 206 on the same substrate as the peripheral circuits of NAND memory 206. Semiconductor structure 201 can include all the peripheral circuits for controlling and sensing NAND memory 206, including, for example, word line drivers 208, page buffers 210, and any other suitable devices. FIG. 2B shows an exemplary layout of the peripheral circuit (e.g., word line drivers 208, page buffers 210) and NAND memory 206 in which the peripheral circuit (e.g., word line drivers 208, page buffers 210) and NAND memory 206 are formed in different regions on the same plane. For example, the peripheral circuit may be formed outside NAND memory 206.

It is understood that the layouts of semiconductor structures 200 and 201 are not limited to the exemplary layouts in FIGS. 2A and 2B. In some embodiments, part of the peripheral circuits of NAND memory 206 (e.g., one or more of word line drivers 208, page buffers 210, and any other suitable devices) may be in semiconductor structure 201 having PLD 202 and SRAM 204. That is, the peripheral circuits of NAND memory 206 may be distributed on both semiconductor structures 200 and 201, according to some other embodiments. In some embodiments, at least some of the peripheral circuits (e.g., word line drivers 208, page buffers 210) and NAND memory 206 (e.g., the array of NAND memory cells) are stacked one over another, i.e., in different planes. For example, NAND memory 206 (e.g., the array of NAND memory cells) may be formed above or below the peripheral circuits to further reduce the chip size. Similarly, in some embodiments, at least part of SRAM 204 (e.g., the array of SRAM cells) and PLD 202 are stacked one over another, i.e., in different planes. For example, SRAM 204 (e.g., the array of SRAM cells) may be formed above or below PLD 202 to further reduce the chip size.

Figure 3A:
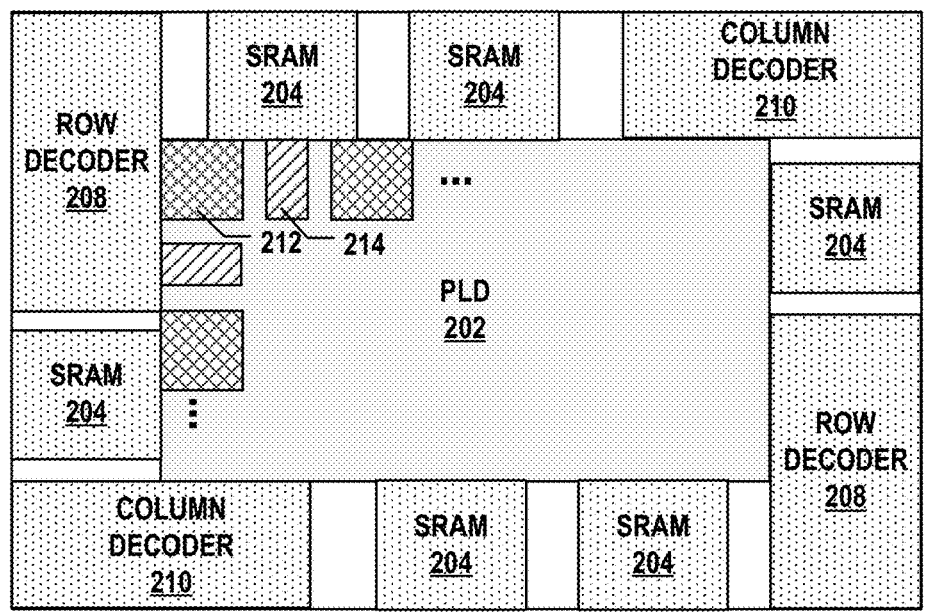
FIG. 3A illustrates a schematic plan view of an exemplary semiconductor structure having a programmable logic device, SRAM, and peripheral circuits, according to some embodiments.

FIG. 3A illustrates a schematic plan view of an exemplary semiconductor structure 300 having a programmable logic device, SRAM, and peripheral circuits, according to some embodiments. Semiconductor structure 300 may be one example of first semiconductor structure 102. Semiconductor structure 300 can include PLD 202 on the same substrate as SRAM 204 and the peripheral circuits (e.g., word line drivers 208, page buffers 210) and fabricated using the same logic process as SRAM 204 and the peripheral circuits. PLD 202 can include one or more of PLAs, PALs, GALs, CPLDs, FPGAs, to name a few. PLD 202 includes one or more of FPGA cores, each of which includes programmable logic blocks 212 arranged in an array, according to some embodiments. For example, each programmable logic blocks 212 may include one or more LUTs. In some embodiments, PLD 202 further includes I/O blocks 214.

Both SRAM 204 and the peripheral circuits (e.g., word line drivers 208, page buffers 210) can be disposed outside of PLD 202. For example, FIG. 3A shows an exemplary layout of SRAM 204 in which the array of SRAM cells are distributed in a plurality of separate regions in semiconductor structure 300, which is outside of PLD 202. Semiconductor structure 300 can include all the peripheral circuits for controlling and sensing NAND memory 206, including, for example, word line drivers 208, page buffers 210, and any other suitable devices. FIG. 3A shows an exemplary layout of the peripheral circuits (e.g., word line drivers 208, page buffers 210) in which the peripheral circuits (e.g., word line drivers 208, page buffers 210) and SRAM 204 are formed in different regions on the same plane outside of PLD 202. It is understood that in some embodiments, at least some of the peripheral circuits (e.g., word line drivers 208, page buffers 210), SRAM 204 (e.g., the array of SRAM cells), and PLD 202 are stacked one over another, i.e., in different planes. For example, SRAM 204 (e.g., the array of SRAM cells) may be formed above or below the peripheral circuits to further reduce the chip size.

Figure 3B:
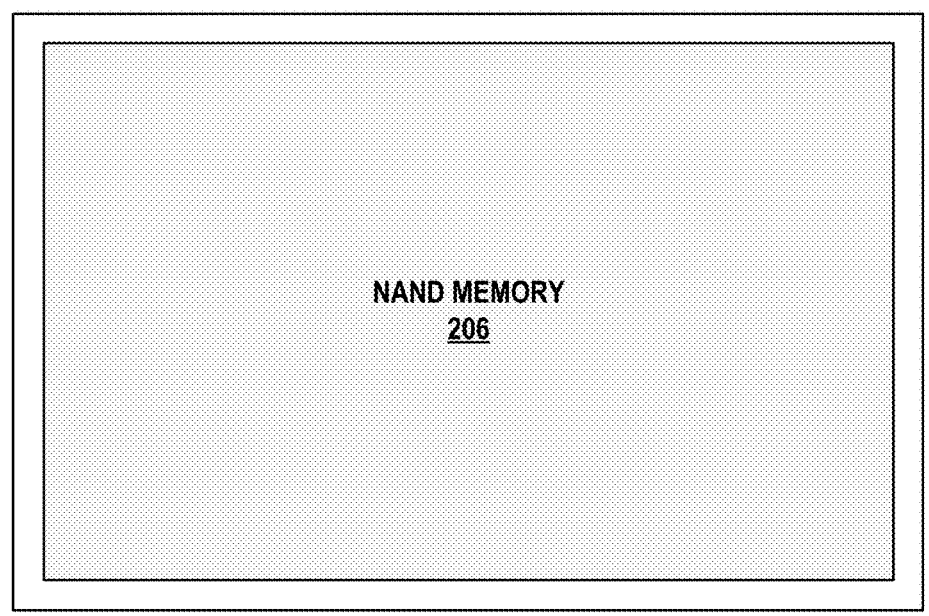
FIG. 3B illustrates a schematic plan view of an exemplary semiconductor structure having NAND memory, according to some embodiments.

FIG. 3B illustrates a schematic plan view of an exemplary semiconductor structure 301 having NAND memory, according to some embodiments. Semiconductor structure 301 may be one example of second semiconductor structure 104. By moving all the peripheral circuits (e.g., word line drivers 208, page buffers 210) away from semiconductor structure 301 (e.g., to semiconductor structure 300), the size of NAND memory 206 (e.g., the number of NAND memory cells) in semiconductor structure 301 can be increased.

Figure 4A:
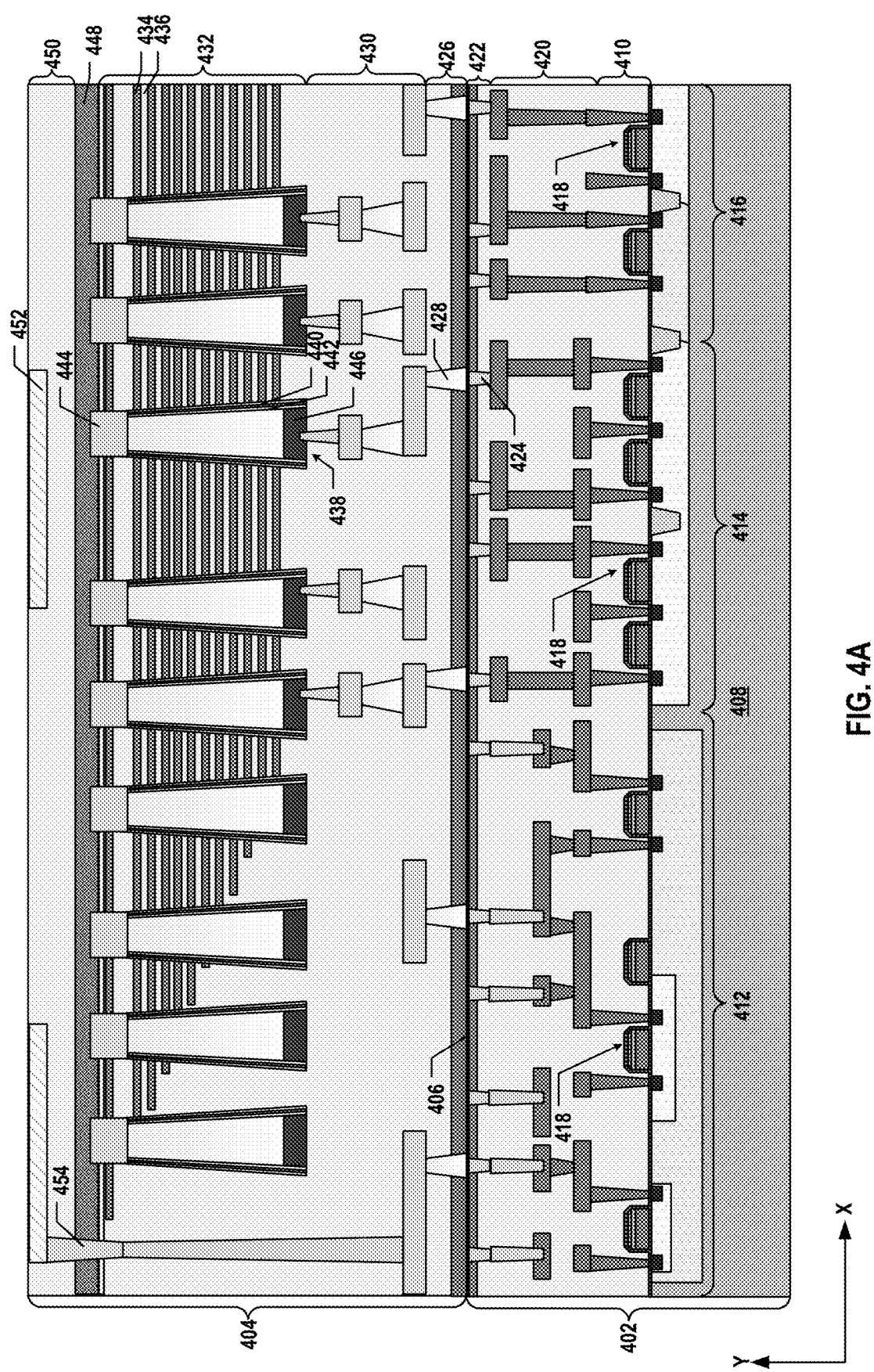
FIG. 4A illustrates a cross-section of an exemplary semiconductor device, according to some embodiments.

FIG. 4A illustrates a cross-section of an exemplary semiconductor device 400, according to some embodiments. As one example of semiconductor device 100 described above with respect to FIG. 1A, semiconductor device 400 is a bonded chip including a first semiconductor structure 402 and a second semiconductor structure 404 stacked over first semiconductor structure 402. First and second semiconductor structures 402 and 404 are joined at a bonding interface 406 therebetween, according to some embodiments. As shown in FIG. 4A, first semiconductor structure 402 can include a substrate 408, which can include silicon (e.g., single crystalline silicon, c-Si), silicon germanium (SiGe), gallium arsenide (GaAs), germanium (Ge), silicon on insulator (SOI), or any other suitable materials.

First semiconductor structure 402 of semiconductor device 400 can include a device layer 410 above substrate 408. It is noted that x- and y-axes are added in FIG. 4A to further illustrate the spatial relationship of the components in semiconductor device 400. Substrate 408 includes two lateral surfaces (e.g., a top surface and a bottom surface) extending laterally in the x-direction (the lateral direction or width direction). As used herein, whether one component (e.g., a layer or a device) is "on," "above," or "below" another component (e.g., a layer or a device) of a semiconductor device (e.g., semiconductor device 400) is determined relative to the substrate of the semiconductor device (e.g., substrate 408) in the y-direction (the vertical direction or thickness direction) when the substrate is positioned in the lowest plane of the semiconductor device in the y-direction. The same notion for describing the spatial relationship is applied throughout the present disclosure.

In some embodiments, device layer 410 includes a programmable logic device 412 on substrate 408 and an array of SRAM cells 414 on substrate 408 and outside of programmable logic device 412. In some embodiments, device layer 410 further includes a peripheral circuit 416 on substrate 408 and outside of programmable logic device 412. For example, peripheral circuit 416 may be part or the entirety of the peripheral circuits for controlling and sensing the NAND memory of semiconductor device 400 as described below in detail. In some embodiments, programmable logic device 412 includes a plurality of transistors 418 forming an array of programmable logic blocks (any I/O blocks in some cases) as described above in detail. In some embodiments, transistors 418 also form array of SRAM cells 414 used as, for example, cache and/or data buffer of semiconductor device 400. For example, array of SRAM cells 414 may function as the internal instruction memory and/or data memory of programmable logic device 412. Array of SRAM cells 414 can be distributed in a plurality of separate regions in first semiconductor structure 402. In some embodiments, transistors 418 further form peripheral circuit 416, i.e., any suitable digital, analog, and/or mixed-signal control and sensing circuits used for facilitating the operation of the NAND memory including, but not limited to, a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors).

Transistors 418 can be formed "on" substrate 408, in which the entirety or part of transistors 418 are formed in substrate 408 (e.g., below the top surface of substrate 408) and/or directly on substrate 408. Isolation regions (e.g., shallow trench isolations (STIs) and doped regions (e.g., source regions and drain regions of transistors 418) can be formed in substrate 408 as well. Transistors 418 are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.), according to some embodiments.

In some embodiments, first semiconductor structure 402 of semiconductor device 400 further includes an interconnect layer 420 above device layer 410 to transfer electrical signals to and from programmable logic device 412 and array of SRAM cells 414 (and peripheral circuit 416 if any). Interconnect layer 420 can include a plurality of interconnects (also referred to herein as "contacts"), including lateral interconnect lines and vertical interconnect access (via) contacts. As used herein, the term "interconnects" can broadly include any suitable types of interconnects, such as middle-end-of-line (MEOL) interconnects and back-end-of-line (BEOL) interconnects. Interconnect layer 420 can further include one or more interlayer dielectric (ILD) layers (also known as "intermetal dielectric (IMD) layers") in which the interconnect lines and via contacts can form. That is, interconnect layer 420 can include interconnect lines and via contacts in multiple ILD layers. The interconnect lines and via contacts in interconnect layer 420 can include conductive materials including, but not limited to, tungsten (W), cobalt (Co), copper (Cu), aluminum (Al), silicides, or any combination thereof. The ILD layers in interconnect layer 420 can include dielectric materials including, but not limited to, silicon oxide, silicon nitride, silicon oxynitride, low dielectric constant (low-k) dielectrics, or any combination thereof. In some embodiments, the devices in device layer 410 are electrically connected to one another through the interconnects in interconnect layer 420. For example, array of SRAM cells 414 may be electrically connected to programmable logic device 412 through interconnect layer 420.

As shown in FIG. 4A, first semiconductor structure 402 of semiconductor device 400 can further include a bonding layer 422 at bonding interface 406 and above interconnect layer 420 and device layer 410 (including programmable logic device 412 and array of SRAM cells 414). Bonding layer 422 can include a plurality of bonding contacts 424 and dielectrics electrically isolating bonding contacts 424. Bonding contacts 424 can include conductive materials including, but not limited to, W, Co, Cu, Al, silicides, or any combination thereof. The remaining area of bonding layer 422 can be formed with dielectrics including, but not limited to, silicon oxide, silicon nitride, silicon oxynitride, low-k dielectrics, or any combination thereof. Bonding contacts 424 and surrounding dielectrics in bonding layer 422 can be used for hybrid bonding.

Similarly, as shown in FIG. 4A, second semiconductor structure 404 of semiconductor device 400 can also include a bonding layer 426 at bonding interface 406 and above bonding layer 422 of first semiconductor structure 402. Bonding layer 426 can include a plurality of bonding contacts 428 and dielectrics electrically isolating bonding contacts 428. Bonding contacts 428 can include conductive materials including, but not limited to, W, Co, Cu, Al, silicides, or any combination thereof. The remaining area of bonding layer 426 can be formed with dielectrics including, but not limited to, silicon oxide, silicon nitride, silicon oxynitride, low-k dielectrics, or any combination thereof. Bonding contacts 428 and surrounding dielectrics in bonding layer 426 can be used for hybrid bonding. Bonding contacts 428 are in contact with bonding contacts 424 at bonding interface 406, according to some embodiments.

As described above, second semiconductor structure 404 can be bonded on top of first semiconductor structure 402 in a face-to-face manner at bonding interface 406. In some embodiments, bonding interface 406 is disposed between bonding layers 422 and 426 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some embodiments, bonding interface 406 is the place at which bonding layers 422 and 426 are met and bonded. In practice, bonding interface 406 can be a layer with a certain thickness that includes the top surface of bonding layer 422 of first semiconductor structure 402 and the bottom surface of bonding layer 426 of second semiconductor structure 404.

In some embodiments, second semiconductor structure 404 of semiconductor device 400 further includes an interconnect layer 430 above bonding layer 426 to transfer electrical signals. Interconnect layer 430 can include a plurality of interconnects, such as MEOL interconnects and BEOL interconnects. In some embodiments, the interconnects in interconnect layer 430 also include local interconnects, such as bit line contacts and word line contacts. Interconnect layer 430 can further include one or more ILD layers in which the interconnect lines and via contacts can form. The interconnect lines and via contacts in interconnect layer 430 can include conductive materials including, but not limited to W, Co, Cu, Al, silicides, or any combination thereof. ILD layers in interconnect layer 430 can include dielectric materials including, but not limited to, silicon oxide, silicon nitride, silicon oxynitride, low-k dielectrics, or any combination thereof.

In some embodiments, second semiconductor structure 404 of semiconductor device 400 includes a NAND flash memory device in which memory cells are provided in the form of an array of 3D NAND memory strings 438 above interconnect layer 430 and bonding layer 426. Each 3D NAND memory string 438 extends vertically through a plurality of pairs each including a conductor layer 434 and a dielectric layer 436, according to some embodiments. The stacked and interleaved conductor layers 434 and dielectric layer 436 are also referred to herein as a memory stack 432. Interleaved conductor layers 434 and dielectric layers 436 in memory stack 432 alternate in the vertical direction, according to some embodiments. In other words, except the ones at the top or bottom of memory stack 432, each conductor layer 434 can be adjoined by two dielectric layers 436 on both sides, and each dielectric layer 436 can be adjoined by two conductor layers 434 on both sides. Conductor layers 434 can each have the same thickness or different thicknesses. Similarly, dielectric layers 436 can each have the same thickness or different thicknesses. Conductor layers 434 can include conductor materials including, but not limited to, W, Co, Cu, Al, doped silicon, silicides, or any combination thereof. Dielectric layers 436 can include dielectric materials including, but not limited to, silicon oxide, silicon nitride, silicon oxynitride, or any combination thereof.

In some embodiments, each 3D NAND memory string 438 is a "charge trap" type of NAND memory string including a semiconductor channel 442 and a memory film 440. In some embodiments, semiconductor channel 442 includes silicon, such as amorphous silicon, polysilicon, or single crystalline silicon. In some embodiments, memory film 440 is a composite dielectric layer including a tunneling layer, a storage layer (also known as "charge trap/storage layer"), and a blocking layer. Each 3D NAND memory string 438 can have a cylinder shape (e.g., a pillar shape). Semiconductor channel 442, the tunneling layer, the storage layer, and the blocking layer of memory film 440 are arranged along a direction from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof. In one example, the blocking layer can include a composite layer of silicon oxide/silicon oxynitride/silicon oxide (ONO). In another example, the blocking layer can include a high-k dielectric layer, such as aluminum oxide ($Al_2O_3$), hafnium oxide ($HfO_2$) or tantalum oxide ($Ta_2O_5$) layer, and so on.

In some embodiments, 3D NAND memory strings 438 further include a plurality of control gates (each being part of a word line). Each conductor layer 434 in memory stack 432 can act as a control gate for each memory cell of 3D NAND memory string 438. In some embodiments, each 3D NAND memory string 438 includes two plugs 444 and 446 at a respective end in the vertical direction. Plug 444 can include a semiconductor material, such as single-crystal silicon, that is epitaxially grown from a semiconductor layer 448. Plug 444 can function as the channel controlled by a source select gate of 3D NAND memory string 438. Plug 444 can be at the upper end of 3D NAND memory string 438 and in contact with semiconductor channel 442. As used herein, the "upper end" of a component (e.g., 3D NAND memory string 438) is the end farther away from substrate 408 in the y-direction, and the "lower end" of the component (e.g., 3D NAND memory string 438) is the end closer to substrate 408 in the y-direction when substrate 408 is positioned in the lowest plane of semiconductor device 400. Another Plug 446 can include semiconductor materials (e.g., polysilicon). By covering the upper end of 3D NAND memory string 438 during the fabrication of second semiconductor structure 404, plug 446 can function as an etch stop layer to prevent etching of dielectrics filled in 3D NAND memory string 438, such as silicon oxide and silicon nitride. In some embodiments, plug 446 functions as the drain of 3D NAND memory string 438.

In some embodiments, second semiconductor structure 404 further includes semiconductor layer 448 disposed above memory stack 432 and 3D NAND memory strings 438. Semiconductor layer 448 can be a thinned substrate on which memory stack 432 and 3D NAND memory strings 438 are formed. In some embodiments, semiconductor layer 448 includes single-crystal silicon from which plugs 444 can be epitaxially grown. In some embodiments, semiconductor layer 448 can include polysilicon, amorphous silicon, SiGe, GaAs, Ge, Salicide, or any other suitable materials. Semiconductor layer 448 can also include isolation regions and doped regions (e.g., functioning as an array common source (ACS) for 3D NAND memory strings 438, not shown). Isolation regions (not shown) can extend across the entire thickness or part of the thickness of semiconductor layer 448 to electrically isolate the doped regions. In some embodiments, a pad oxide layer including silicon oxide is disposed between memory stack 432 and semiconductor layer 448.

It is understood that 3D NAND memory strings 438 are not limited to the "charge trap" type of 3D NAND memory strings and may be "floating gate" type of 3D NAND memory strings in other embodiments. Semiconductor layer 448 may include polysilicon as the source plate of the "floating gate" type of 3D NAND memory strings.

As shown in FIG. 4A, second semiconductor structure 404 of semiconductor device 400 can further include a pad-out interconnect layer 450 above semiconductor layer 448. Pad-out interconnect layer 450 can include interconnects, e.g., contact pads 452, in one or more ILD layers. Pad-out interconnect layer 450 and interconnect layer 430 can be formed at opposite sides of semiconductor layer 448. In some embodiments, the interconnects in pad-out interconnect layer 450 can transfer electrical signals between semiconductor device 400 and outside circuits, e.g., for pad-out purposes.

In some embodiments, second semiconductor structure 404 further includes one or more contacts 454 extending through semiconductor layer 448 to electrically connect pad-out interconnect layer 450 and interconnect layers 430 and 420. As a result, programmable logic device 412 and array of 3D NAND memory strings 438 (and peripheral circuit 416 if any) can be electrically connected to array of 3D NAND memory strings 438 through interconnect layers 430 and 420 as well as bonding contacts 428 and 424. Moreover, programmable logic device 412, array of SRAM cells 414, and array of 3D NAND memory strings 438 can be electrically connected to outside circuits through contacts 454 and pad-out interconnect layer 450.

Figure 4B:
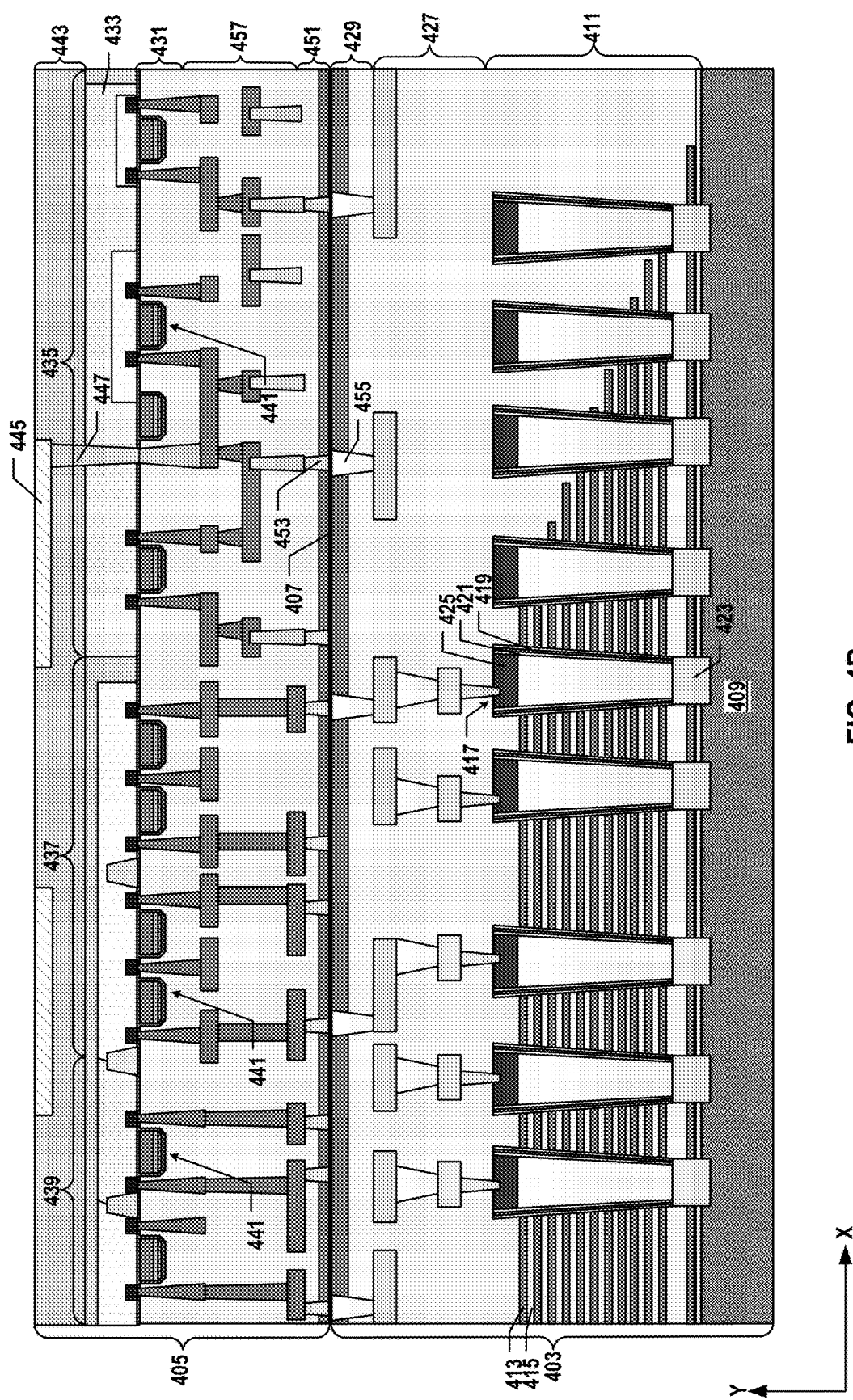
FIG. 4B illustrates a cross-section of another exemplary semiconductor device, according to some embodiments.

FIG. 4B illustrates a cross-section of another exemplary semiconductor device 401, according to some embodiments. As one example of semiconductor device 101 described above with respect to FIG. 1B, semiconductor device 401 is a bonded chip including a second semiconductor structure 403 and a first semiconductor structure 405 stacked over second semiconductor structure 403. Similar to semiconductor device 400 described above in FIG. 4A, semiconductor device 401 represents an example of a bonded chip in which first semiconductor structure 405 including a programmable logic device and SRAM and second semiconductor structure 403 including NAND memory are formed separately and bonded in a face-to-face manner at a bonding interface 407. Different from semiconductor device 400 described above in FIG. 4A in which first semiconductor structure 402 including the programmable logic device and SRAM is below second semiconductor structure 404 including the NAND memory, semiconductor device 401 in FIG. 4B includes first semiconductor structure 405 including the programmable logic device and SRAM disposed above second semiconductor structure 403 including the NAND memory. It is understood that the details of similar structures (e.g., materials, fabrication process, functions, etc.) in both semiconductor devices 400 and 401 may not be repeated below.

Second semiconductor structure 403 of semiconductor device 401 can include a substrate 409 and a memory stack 411 including interleaved conductor layers 413 and dielectric layers 415 above substrate 409. In some embodiments, an array of 3D NAND memory strings 417 each extends vertically through interleaved conductor layers 413 and dielectric layers 415 in memory stack 411 above substrate 409. Each 3D NAND memory string 417 can include a semiconductor channel 421 and a memory film 419. Each 3D NAND memory string 417 further includes two plugs 423 and 425 at its lower end and upper end, respectively. 3D NAND memory strings 417 can be "charge trap" type of 3D NAND memory strings or "floating gate" type of 3D NAND memory strings. In some embodiments, a pad oxide layer including silicon oxide is disposed between memory stack 411 and substrate 409.

In some embodiments, second semiconductor structure 403 of semiconductor device 401 also includes an interconnect layer 427 above memory stack 411 and 3D NAND memory strings 417 to transfer electrical signals to and from 3D NAND memory strings 417. Interconnect layer 427 can include a plurality of interconnects, including interconnect lines and via contacts. In some embodiments, the interconnects in interconnect layer 427 also include local interconnects, such as bit line contacts and word line contacts. In some embodiments, second semiconductor structure 403 of semiconductor device 401 further includes a bonding layer 429 at bonding interface 407 and above interconnect layer 427 and memory stack 411 and 3D NAND memory strings 417. Bonding layer 429 can include a plurality of bonding contacts 455 and dielectrics surrounding and electrically isolating bonding contacts 455.

As shown in FIG. 4B, first semiconductor structure 405 of semiconductor device 401 includes another bonding layer 451 at bonding interface 407 and above bonding layer 429. Bonding layer 451 can include a plurality of bonding contacts 453 and dielectrics surrounding and electrically isolating bonding contacts 453. Bonding contacts 453 are in contact with bonding contacts 455 at bonding interface 407, according to some embodiments. In some embodiments, first semiconductor structure 405 of semiconductor device 401 also includes an interconnect layer 457 above bonding layer 451 to transfer electrical signals. Interconnect layer 457 can include a plurality of interconnects, including interconnect lines and via contacts.

First semiconductor structure 405 of semiconductor device 401 can further include a device layer 431 above interconnect layer 457 and bonding layer 451. In some embodiments, device layer 431 includes a programmable logic device 435 above interconnect layer 457 and bonding layer 451, and an array of SRAM cells 437 above interconnect layer 457 and bonding layer 451 and outside of programmable logic device 435. In some embodiments, device layer 431 further includes a peripheral circuit 439 above interconnect layer 457 and bonding layer 451 and outside of programmable logic device 435. For example, peripheral circuit 439 may be part or the entirety of the peripheral circuits for controlling and sensing array of 3D NAND memory strings 417. In some embodiments, the devices in device layer 431 are electrically connected to one another through the interconnects in interconnect layer 457. For example, array of SRAM cells 437 may be electrically connected to programmable logic device 435 through interconnect layer 457.

In some embodiments, programmable logic device 435 includes a plurality of transistors 441 forming an array of programmable logic blocks (any I/O blocks in some cases) as described above in detail. Transistors 441 can be formed "on" a semiconductor layer 433, in which the entirety or part of transistors 441 are formed in semiconductor layer 433 and/or directly on semiconductor layer 433. Isolation regions (e.g., STIs) and doped regions (e.g., source regions and drain regions of transistors 441) can be formed in semiconductor layer 433 as well. Transistors 441 can form array of SRAM cells 437 (and peripheral circuit 439 if any). Transistors 441 are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.), according to some embodiments.

In some embodiments, first semiconductor structure 405 further includes semiconductor layer 433 disposed above device layer 431. Semiconductor layer 433 can be above and in contact with programmable logic device 435 and array of SRAM cells 437. Semiconductor layer 433 can be a thinned substrate on which transistors 441 are formed. In some embodiments, semiconductor layer 433 includes single-crystal silicon. In some embodiments, semiconductor layer 433 can include polysilicon, amorphous silicon, SiGe, GaAs, Ge, or any other suitable materials. Semiconductor layer 433 can also include isolation regions and doped regions.

As shown in FIG. 4B, first semiconductor structure 405 of semiconductor device 401 can further include a pad-out interconnect layer 443 above semiconductor layer 433. Pad-out interconnect layer 443 can include interconnects, e.g., contact pads 445, in one or more ILD layers. In some embodiments, the interconnects in pad-out interconnect layer 443 can transfer electrical signals between semiconductor device 401 and outside circuits, e.g., for pad-out purposes. In some embodiments, first semiconductor structure 405 further includes one or more contacts 447 extending through semiconductor layer 433 to electrically connect pad-out interconnect layer 443 and interconnect layers 457 and 427. As a result, programmable logic device 435 and array of SRAM cells 437 (and peripheral circuit 439 if any) can also be electrically connected to array of 3D NAND memory strings 417 through interconnect layers 457 and 427 as well as bonding contacts 453 and 455. Moreover, programmable logic device 435, array of SRAM cells 437, and array of 3D NAND memory strings 417 can be electrically connected to outside circuits through contacts 447 and pad-out interconnect layer 443.

Figure 5A:
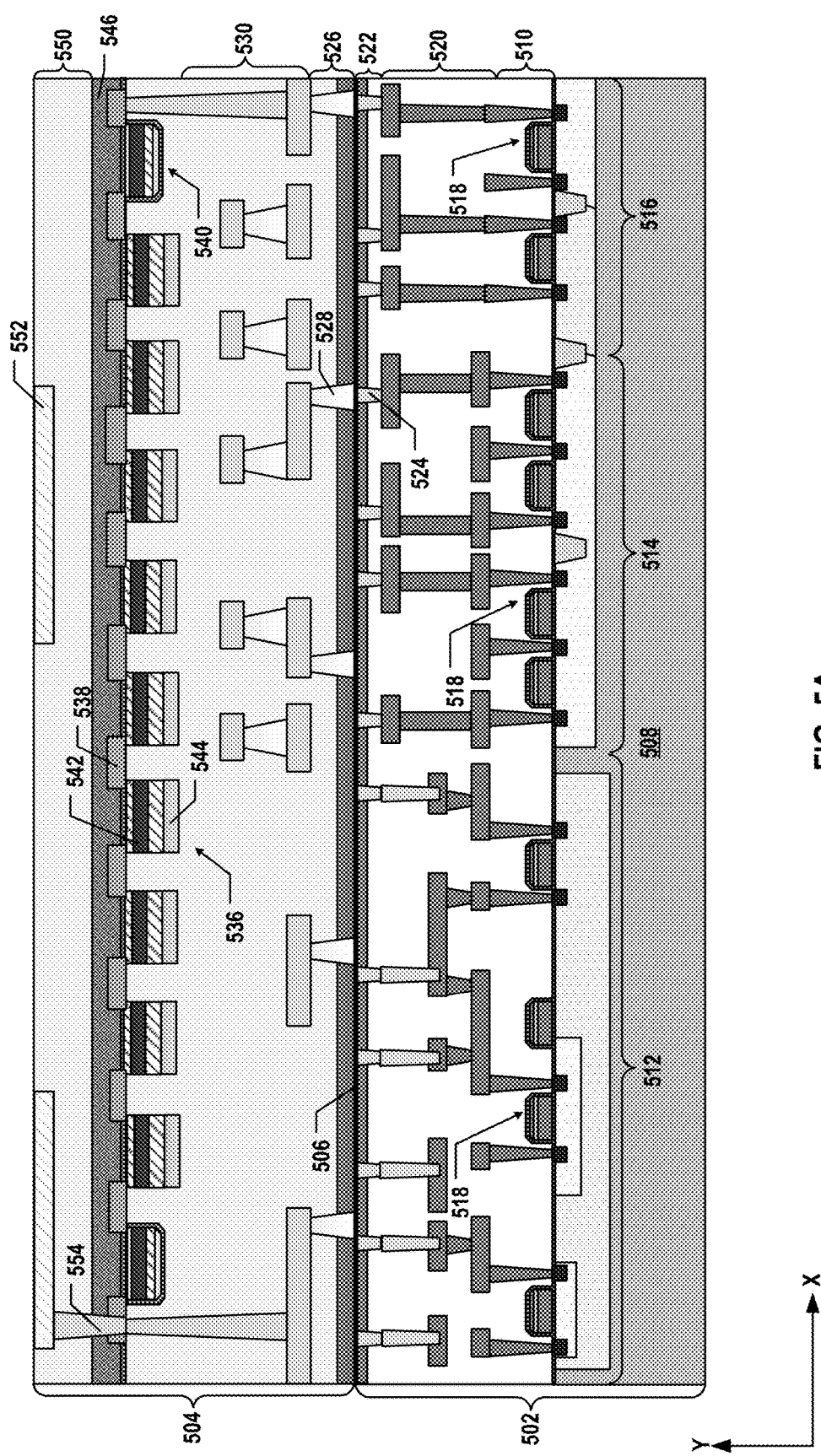
FIG. 5A illustrates a cross-section of still another exemplary semiconductor device, according to some embodiments.

FIG. 5A illustrates a cross-section of still another exemplary semiconductor device 500, according to some embodiments. Similar to semiconductor device 400 described above in FIG. 4A, semiconductor device 500 represents an example of a bonded chip including first semiconductor structure 502 having a programmable logic device 512, an array of SRAM cells 514, and a peripheral circuit 516. Different from semiconductor device 400 described above in FIG. 4A that includes second semiconductor structure 404 having 3D NAND memory strings 438, semiconductor device 500 in FIG. 5A includes a second semiconductor structure 504 having 2D NAND memory cells 536. Similar to semiconductor device 400 described above in FIG. 4A, first and second semiconductor structures 502 and 504 of semiconductor device 500 are bonded in a face-to-face manner at a bonding interface 506, as shown in FIG. 5A. It is understood that details of similar structures (e.g., materials, fabrication process, functions, etc.) in both semiconductor devices 400 and 500 may not be repeated below.

First semiconductor structure 502 of semiconductor device 500 can include a device layer 510 above a substrate 508. In some embodiments, device layer 510 includes programmable logic device 512 on substrate 508, and array of SRAM cells 514 on substrate 508 and outside of programmable logic device 512. In some embodiments, device layer 510 further includes peripheral circuit 516 on substrate 508 and outside of programmable logic device 512. For example, peripheral circuit 516 may be part or the entirety of the peripheral circuits for controlling and sensing the NAND memory of semiconductor device 500. In some embodiments, programmable logic device 512 includes a plurality of transistors 518 forming an array of programmable logic blocks (any I/O blocks in some cases) as described above in detail. In some embodiments, transistors 518 also form array of SRAM cells 514 used as, for example, cache and/or data buffer of semiconductor device 500. In some embodiments, transistors 518 further form peripheral circuit 516, i.e., any suitable digital, analog, and/or mixed-signal control and sensing circuits used for facilitating the operation of the NAND memory.

In some embodiments, first semiconductor structure 502 of semiconductor device 500 also includes an interconnect layer 520 above device layer 510 to transfer electrical signals to and from programmable logic device 512 and array of SRAM cells 514 (and peripheral circuit 516 if any). Interconnect layer 520 can include a plurality of interconnects, including interconnect lines and via contacts. In some embodiments, first semiconductor structure 502 of semiconductor device 500 further includes a bonding layer 522 at bonding interface 506 and above interconnect layer 520 and device layer 510 (including programmable logic device 512 and array of SRAM cells 514). Bonding layer 522 can include a plurality of bonding contacts 524 and dielectrics surrounding and electrically isolating bonding contacts 524.

Similarly, as shown in FIG. 5A, second semiconductor structure 504 of semiconductor device 500 can also include a bonding layer 526 at bonding interface 506 and above bonding layer 522 of first semiconductor structure 502. Bonding layer 526 can include a plurality of bonding contacts 528 and dielectrics electrically isolating bonding contacts 528. Bonding contacts 528 are in contact with bonding contacts 524 at bonding interface 506, according to some embodiments. In some embodiments, second semiconductor structure 504 of semiconductor device 500 also includes an interconnect layer 530 above bonding layer 526 to transfer electrical signals. Interconnect layer 530 can include a plurality of interconnects, including interconnect lines and via contacts.

In some embodiments, second semiconductor structure 504 of semiconductor device 500 includes a NAND flash memory device in which memory cells are provided in the form of an array of 2D NAND memory cells 536 above interconnect layer 530 and bonding layer 526. Array of 2D NAND memory cells 536 can include a plurality of 2D NAND memory strings, each of which includes a plurality of 2D NAND memory cells 536 connected in series by sources/drains 538 (resembling a NAND gate) and two select transistors 540 at the ends of the 2D NAND memory string, respectively. In some embodiments, each 2D NAND memory string further includes one or more select gates and/or dummy gates besides select transistors 540. In some embodiments, each 2D NAND memory cell 536 includes a floating-gate transistor having a floating gate 542 and a control gate 544 stacked vertically. Floating gate 542 can include semiconductor materials, such as polysilicon. Control gate 544 can be part of the word line of the NAND flash memory device and include conductive materials including, but not limited to, W, Co, Cu, Al, doped polysilicon, silicides, or any combination thereof. In some embodiments, the floating-gate transistor further includes dielectric layers, such as a blocking layer disposed vertically between control gate 544 and floating gate 542 and a tunneling layer disposed above floating gate 542. The blocking layer can include silicon oxide, silicon oxynitride, high-k dielectrics, or any combination thereof. The tunneling layer can include silicon oxide, silicon oxynitride, or a combination thereof. Channels can be formed laterally between sources/drains 538 and above the gate stacks (including the tunneling layer, floating gate 542, the blocking layer, and control gate 544). Each channel is controlled by the voltage signal applied to the respective gate stack through control gate 544, according to some embodiments. It is understood that 2D NAND memory cell 536 may include a charge-trap transistor, which replaces floating gate 542 with a charge-trap layer (storage layer) as described above in detail. In some embodiments, the storage layer includes silicon nitride, silicon oxynitride, or any combination thereof and has a thickness smaller than that of floating gate 542.

In some embodiments, second semiconductor structure 504 further includes semiconductor layer 546 disposed above and in contact with array of 2D NAND memory cells 536. Semiconductor layer 546 can be a thinned substrate on which 2D NAND memory cells 536 are formed. In some embodiments, semiconductor layer 546 includes single-crystal silicon. In some embodiments, semiconductor layer 546 includes polysilicon, amorphous silicon, SiGe, GaAs, Ge, or any other suitable materials. Semiconductor layer 546 can also include isolation regions and doped regions (e.g., functioning as sources/drains 538 of 2D NAND memory cells 536).

As shown in FIG. 5A, second semiconductor structure 504 of semiconductor device 500 can further include a pad-out interconnect layer 550 above semiconductor layer 546. Pad-out interconnect layer 550 includes interconnects, e.g., contact pads 552, in one or more ILD layers. In some embodiments, the interconnects in pad-out interconnect layer 550 can transfer electrical signals between semiconductor device 500 and outside circuits, e.g., for pad-out purposes. In some embodiments, second semiconductor structure 504 further includes one or more contacts 554 extending through semiconductor layer 546 to electrically connect pad-out interconnect layer 550 and interconnect layers 530 and 520. As a result, programmable logic device 512 and array of SRAM cells 514 can be electrically connected to array of 2D NAND memory cells 536 through interconnect layers 530 and 520 as well as bonding contacts 528 and 524. Moreover, programmable logic device 512, array of SRAM cells 514, and array of 2D NAND memory cells 536 can be electrically connected to outside circuits through contacts 554 and pad-out interconnect layer 550.

Figure 5B:
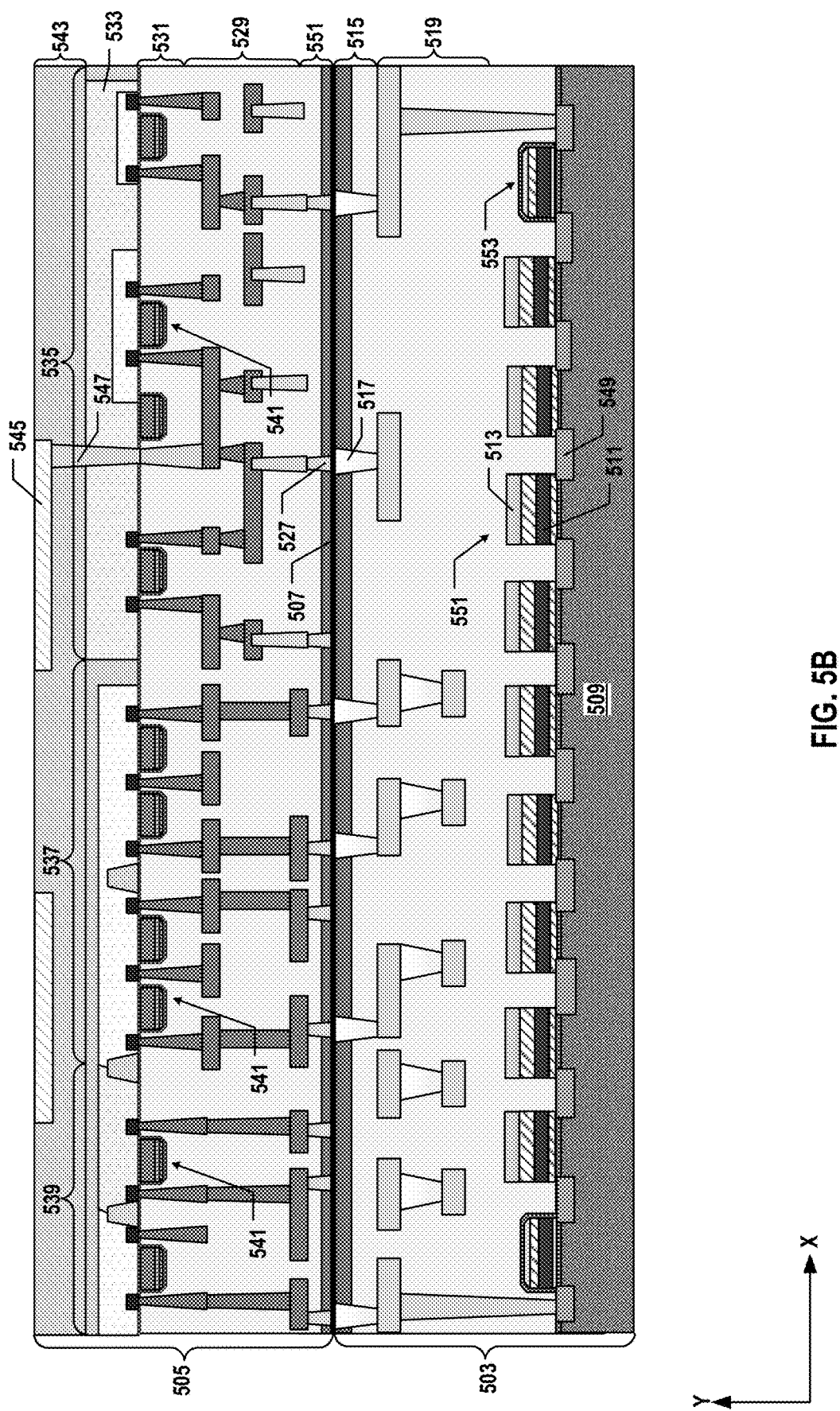
FIG. 5B illustrates a cross-section of yet another exemplary semiconductor device, according to some embodiments.

FIG. 5B illustrates a cross-section of yet another exemplary semiconductor device 501, according to some embodiments. As one example of semiconductor device 101 described above with respect to FIG. 1B, semiconductor device 501 is a bonded chip including a second semiconductor structure 503 and a first semiconductor structure 505 stacked over second semiconductor structure 503. Similar to semiconductor device 500 described above in FIG. 5A, semiconductor device 501 represents an example of a bonded chip in which first semiconductor structure 505 including a programmable logic device and SRAM and second semiconductor structure 503 including an array of 2D NAND memory cells are formed separately and bonded in a face-to-face manner at a bonding interface 507. Different from semiconductor device 500 described above in FIG. 5A in which first semiconductor structure 502 including the programmable logic device and SRAM is below second semiconductor structure 504 including the array of 2D NAND memory cells, semiconductor device 501 in FIG. 5B includes first semiconductor structure 505 including the programmable logic device and SRAM disposed above second semiconductor structure 503 including the array of 2D NAND memory cells. It is understood that the details of similar structures (e.g., materials, fabrication process, functions, etc.) in both semiconductor devices 500 and 501 may not be repeated below.

In some embodiments, second semiconductor structure 503 of semiconductor device 501 includes a NAND flash memory device in which memory cells are provided in the form of an array of 2D NAND memory cells 551 on a substrate 509. Array of 2D NAND memory cells 551 can include a plurality of 2D NAND memory strings, each of which includes a plurality of memory cells connected in series by sources/drains 549 (resembling a NAND gate) and two select transistors 553 at the ends of the 2D NAND memory string, respectively. In some embodiments, each 2D NAND memory cell 551 includes a floating-gate transistor having a floating gate 511 and a control gate 513 stacked vertically. In some embodiments, the floating-gate transistor further includes dielectric layers, such as a blocking layer disposed vertically between control gate 513 and floating gate 511 and a tunneling layer disposed below floating gate 511. Channels can be formed laterally between sources/drains 549 and below the gate stacks (including the tunneling layer, floating gate 511, the blocking layer, and control gate 513). Each channel is controlled by the voltage signal applied to the respective gate stack through control gate 513, according to some embodiments. It is understood that 2D NAND memory cell 551 may include a charge-trap transistor, which replaces floating gate 511 with a storage layer.

In some embodiments, second semiconductor structure 503 of semiconductor device 501 also includes an interconnect layer 519 above array of 2D NAND memory cells 551 to transfer electrical signals to and from array of 2D NAND memory cells 551. Interconnect layer 519 can include a plurality of interconnects, including interconnect lines and via contacts. In some embodiments, the interconnects in interconnect layer 519 also include local interconnects, such as bit line contacts and word line contacts. In some embodiments, second semiconductor structure 503 of semiconductor device 501 further includes a bonding layer 515 at bonding interface 507 and above interconnect layer 519 and array of 2D NAND memory cells 551. Bonding layer 515 can include a plurality of bonding contacts 517 and dielectrics surrounding and electrically isolating bonding contacts 517.

As shown in FIG. 5B, first semiconductor structure 505 of semiconductor device 501 includes another bonding layer 553 at bonding interface 507 and above bonding layer 515. Bonding layer 553 can include a plurality of bonding contacts 527 and dielectrics surrounding and electrically isolating bonding contacts 527. Bonding contacts 527 are in contact with bonding contacts 517 at bonding interface 507, according to some embodiments. In some embodiments, first semiconductor structure 505 of semiconductor device 501 also includes an interconnect layer 529 above bonding layer 553 to transfer electrical signals. Interconnect layer 529 can include a plurality of interconnects, including interconnect lines and via contacts.

First semiconductor structure 505 of semiconductor device 501 can further include a device layer 531 above interconnect layer 529 and bonding layer 553. In some embodiments, device layer 531 includes a programmable logic device 535 above interconnect layer 529 and bonding layer 553, and an array of SRAM cells 537 above interconnect layer 529 and bonding layer 553 and outside of programmable logic device 535. In some embodiments, device layer 531 further includes a peripheral circuit 539 above interconnect layer 529 and bonding layer 553 and outside of programmable logic device 535. For example, peripheral circuit 539 may be part or the entirety of the peripheral circuits for controlling and sensing array of 2D NAND memory cells 551. In some embodiments, the devices in device layer 531 are electrically connected to one another through the interconnects in interconnect layer 529. For example, array of SRAM cells 537 may be electrically connected to programmable logic device 535 through interconnect layer 529.

In some embodiments, programmable logic device 535 includes a plurality of transistors 541 forming an array of programmable logic blocks (and I/O blocks in some cases). Transistors 541 can be formed "on" a semiconductor layer 533, in which the entirety or part of transistors 541 are formed in semiconductor layer 533 and/or directly on semiconductor layer 533. Isolation regions (e.g., STIs) and doped regions (e.g., source regions and drain regions of transistors 541) can be formed in semiconductor layer 533 as well. Transistors 541 can also form array of SRAM cells 537 (and peripheral circuit 539 if any). Transistors 541 are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.), according to some embodiments.

In some embodiments, first semiconductor structure 505 further includes semiconductor layer 533 disposed above device layer 531. Semiconductor layer 533 can be above and in contact with programmable logic device 535 and array of SRAM cells 537. Semiconductor layer 533 can be a thinned substrate on which transistors 541 are formed. In some embodiments, semiconductor layer 533 includes single-crystal silicon. In some embodiments, semiconductor layer 533 can include polysilicon, amorphous silicon, SiGe, GaAs, Ge, or any other suitable materials. Semiconductor layer 533 can also include isolation regions and doped regions.

As shown in FIG. 5B, first semiconductor structure 505 of semiconductor device 501 can further include a pad-out interconnect layer 543 above semiconductor layer 533. Pad-out interconnect layer 543 includes interconnects, e.g., contact pads 545, in one or more ILD layers. In some embodiments, the interconnects in pad-out interconnect layer 543 can transfer electrical signals between semiconductor device 501 and outside circuits, e.g., for pad-out purposes. In some embodiments, first semiconductor structure 505 further includes one or more contacts 547 extending through semiconductor layer 533 to electrically connect pad-out interconnect layer 543 and interconnect layers 529 and 519. As a result, programmable logic device 535 and array of SRAM cells 537 (and peripheral circuit 539 if any) can be electrically connected to array of 2D NAND memory cells 551 through interconnect layers 529 and 519 as well as bonding contacts 527 and 517. Moreover, programmable logic device 535, array of SRAM cells 537, and array of 2D NAND memory cells 551 can be electrically connected to outside circuits through contacts 547 and pad-out interconnect layer 543.

Figure 6A:
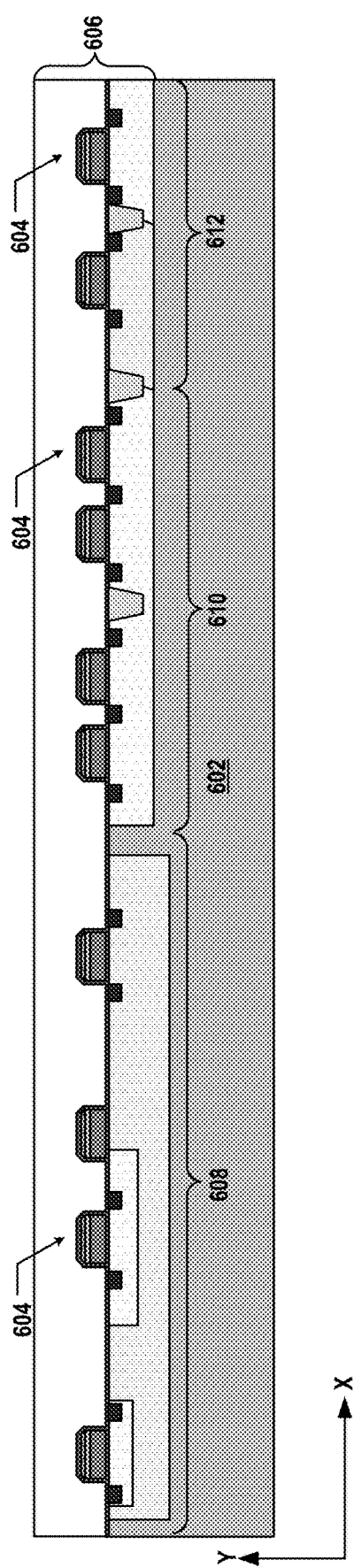
FIGS. 6A and 6B illustrate a fabrication process for forming an exemplary semiconductor structure having a programmable logic device, SRAM, and peripheral circuits, according to some embodiments.
Figure 6B:
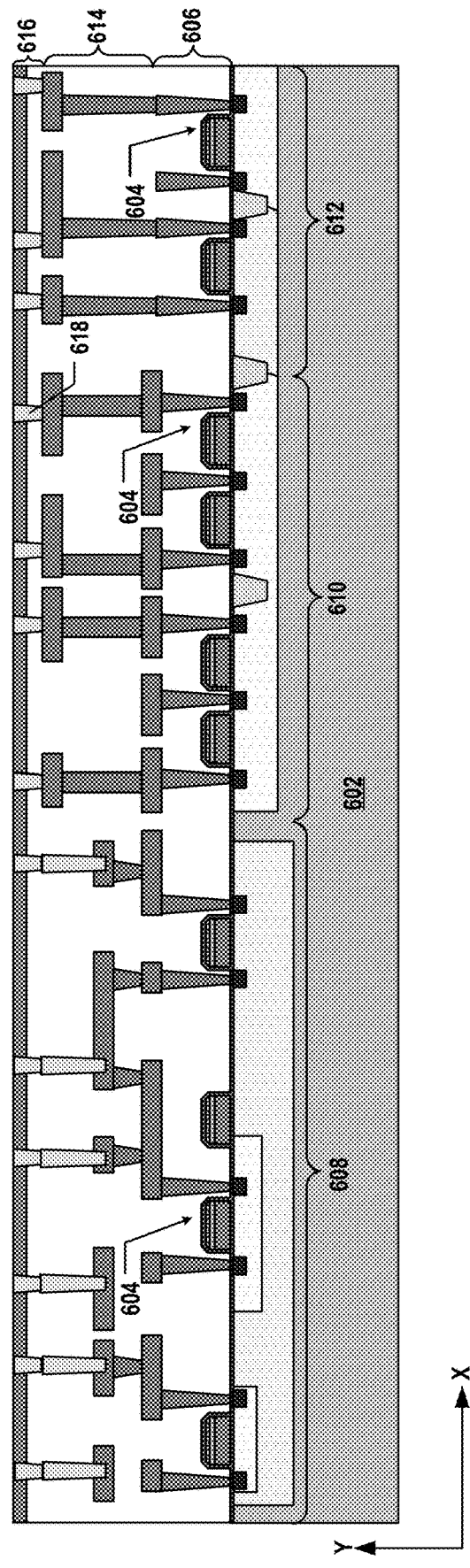
Figure 7A:
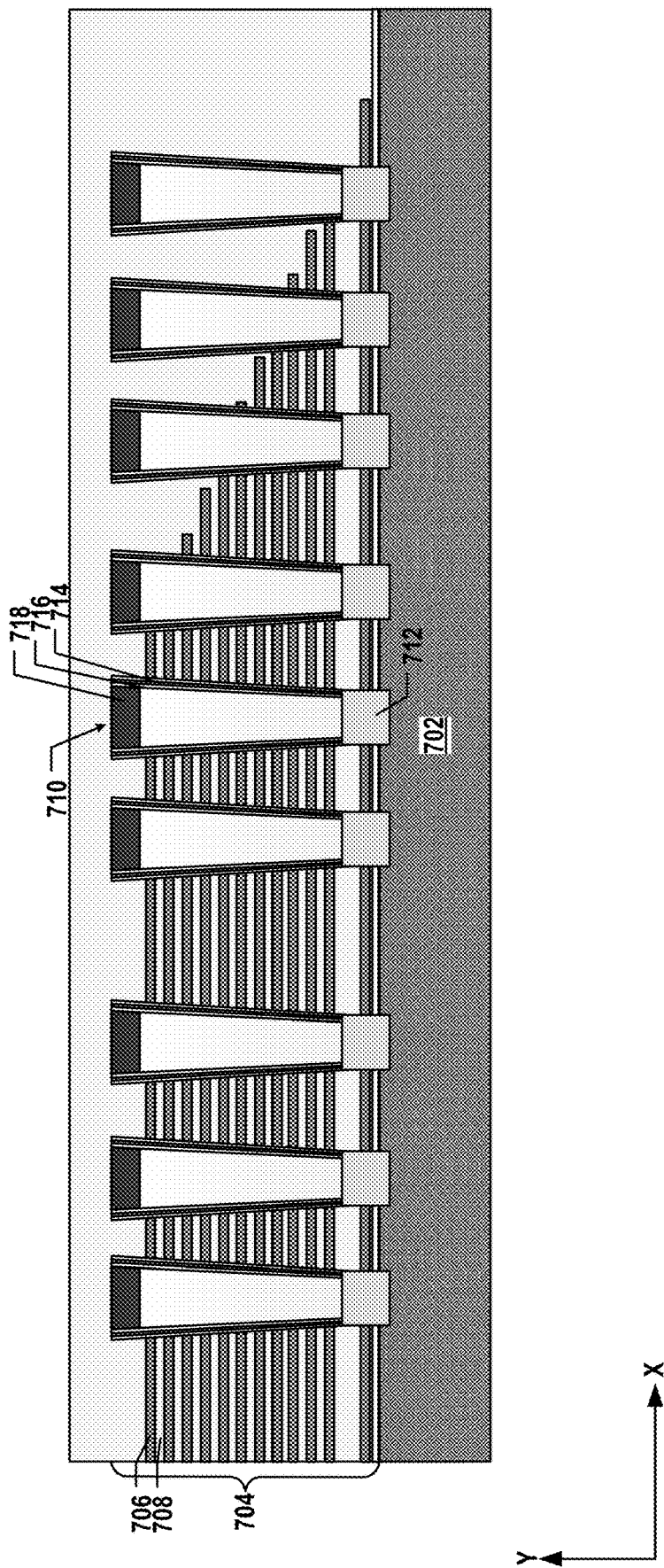
FIGS. 7A and 7B illustrate a fabrication process for forming an exemplary semiconductor structure having 3D NAND memory strings, according to some embodiments.
Figure 7B:
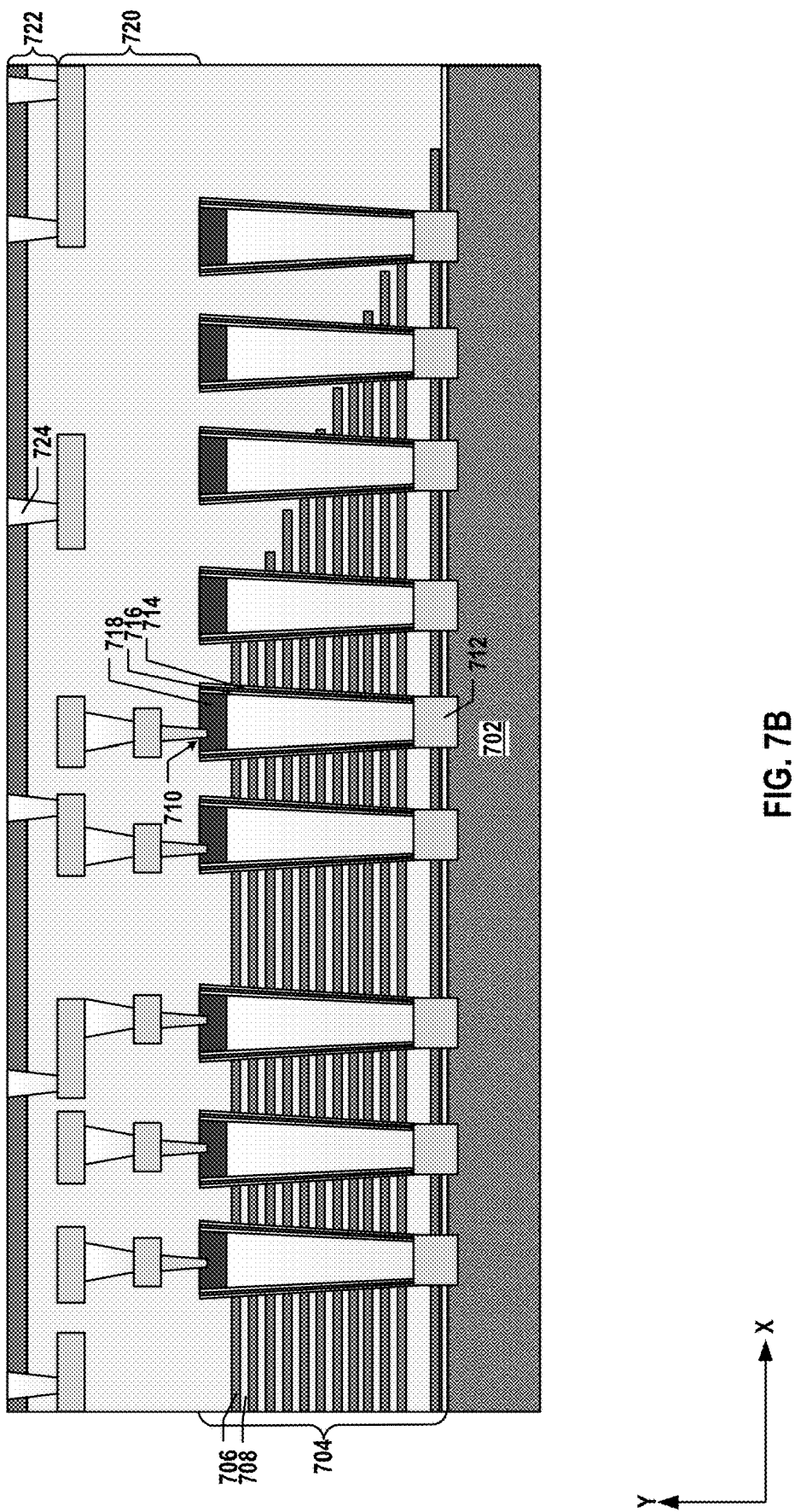
Figure 7C:
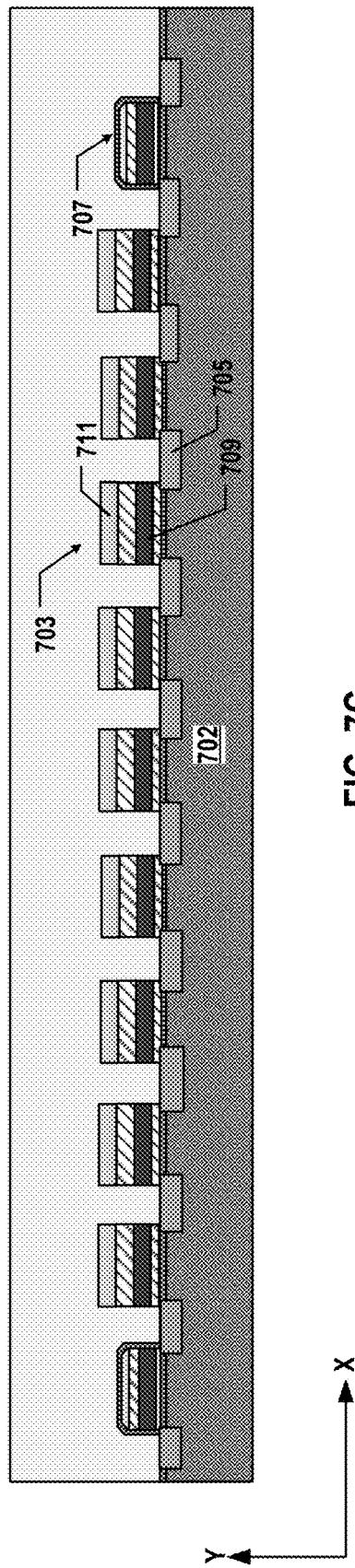
FIGS. 7C and 7D illustrate a fabrication process for forming an exemplary semiconductor structure having 2D NAND memory cells, according to some embodiments.
Figure 7D:
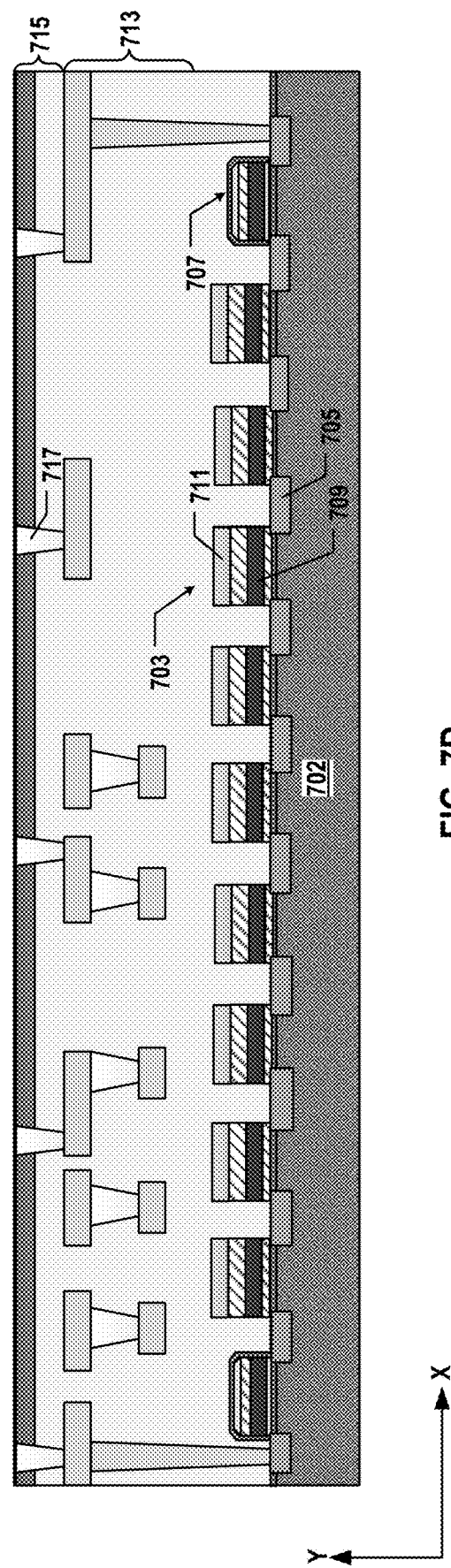
Figure 8A:
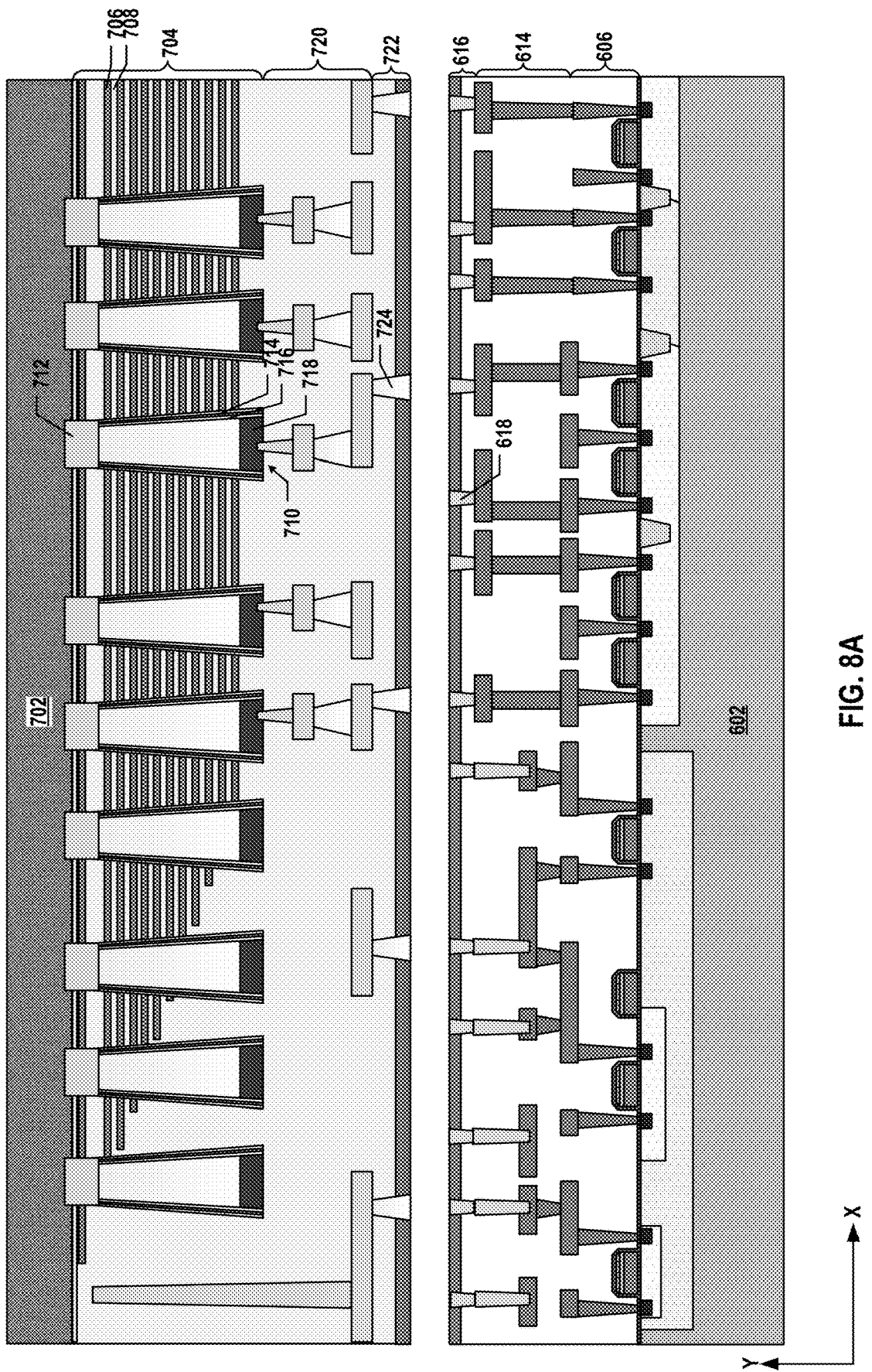
FIGS. 8A and 8B illustrate a fabrication process for forming an exemplary semiconductor device, according to some embodiments.
Figure 8B:
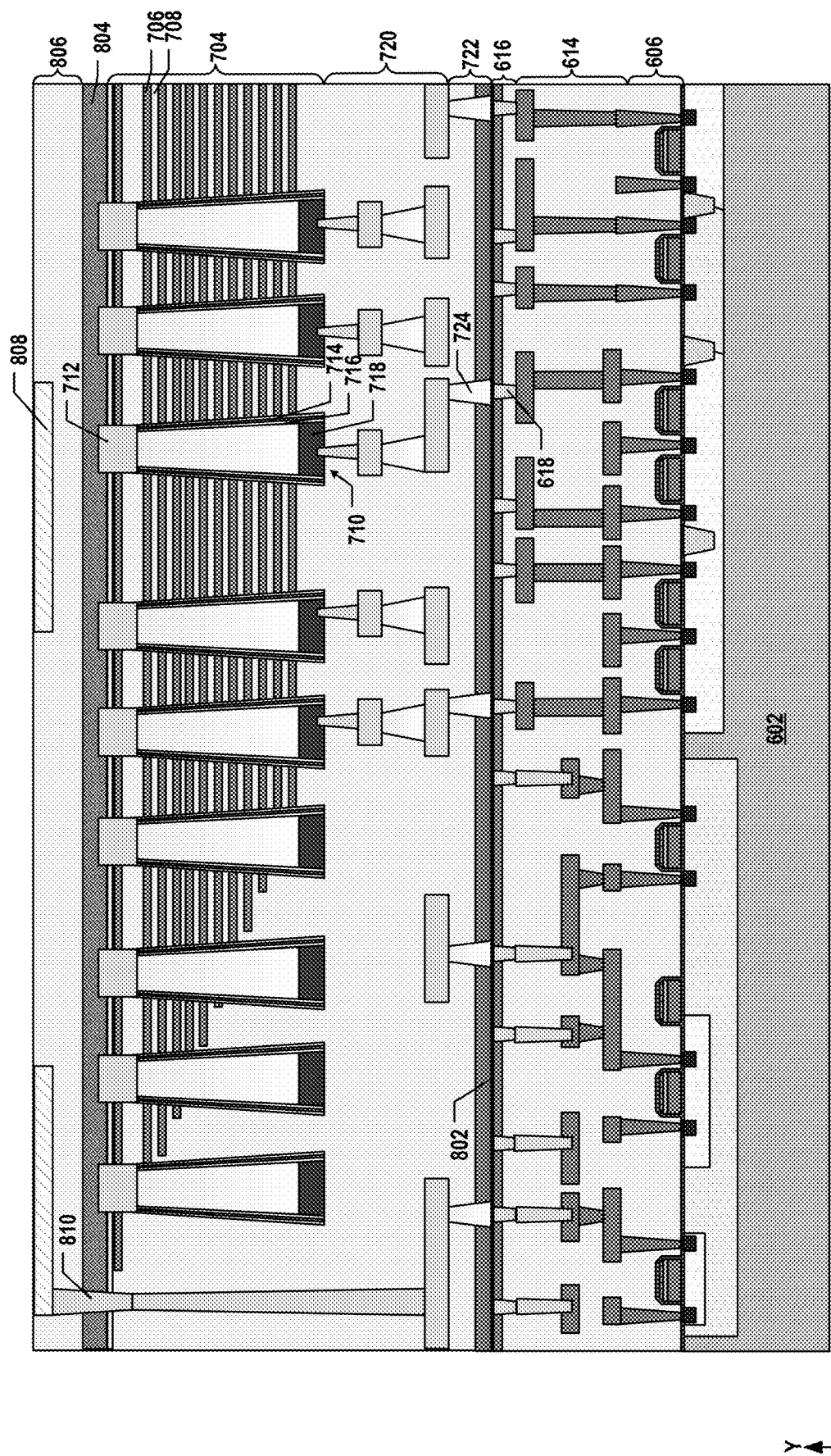
Figure 8C:
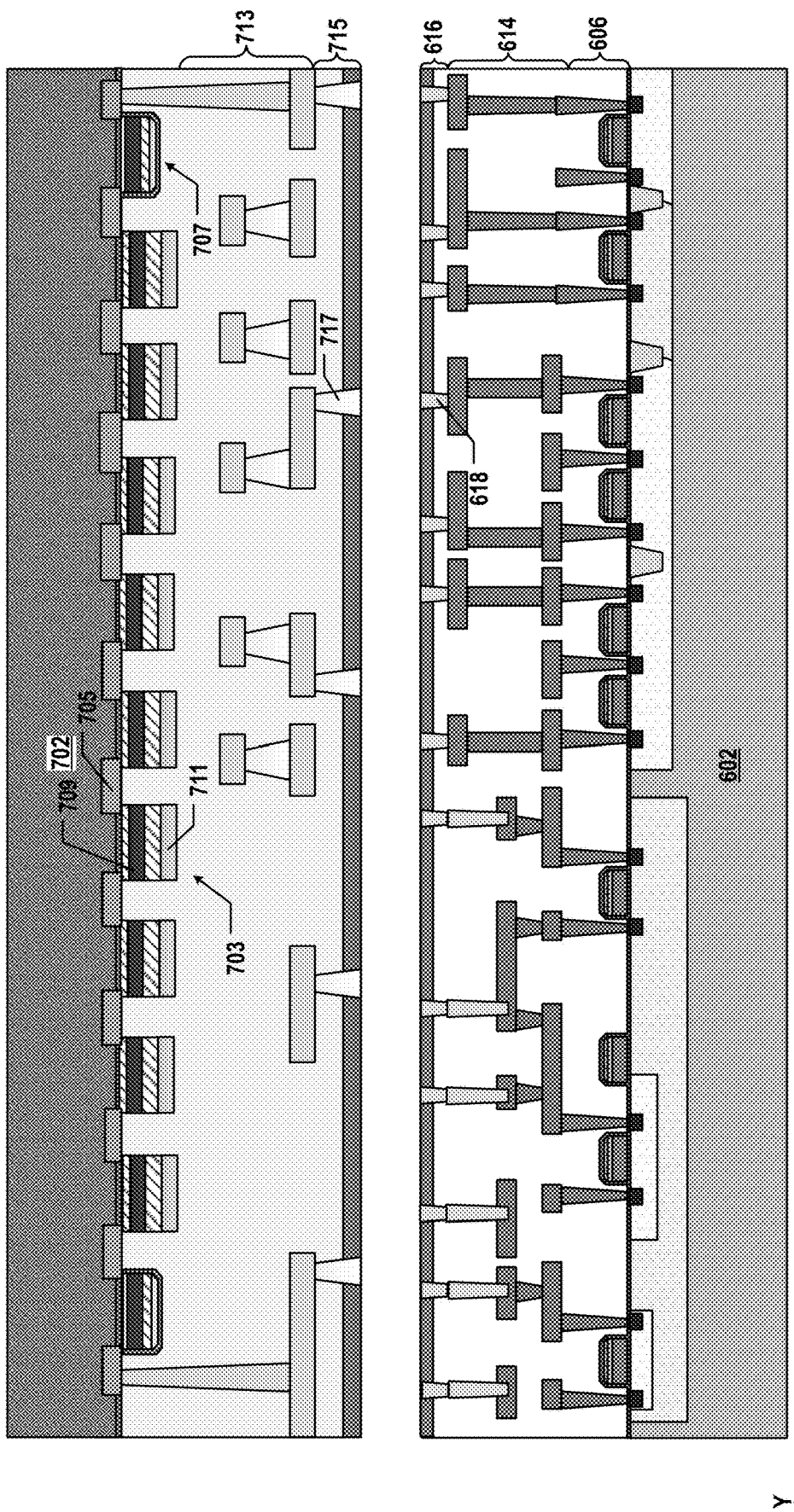
FIGS. 8C and 8D illustrate a fabrication process for forming another exemplary semiconductor device, according to some embodiments.
Figure 8D:
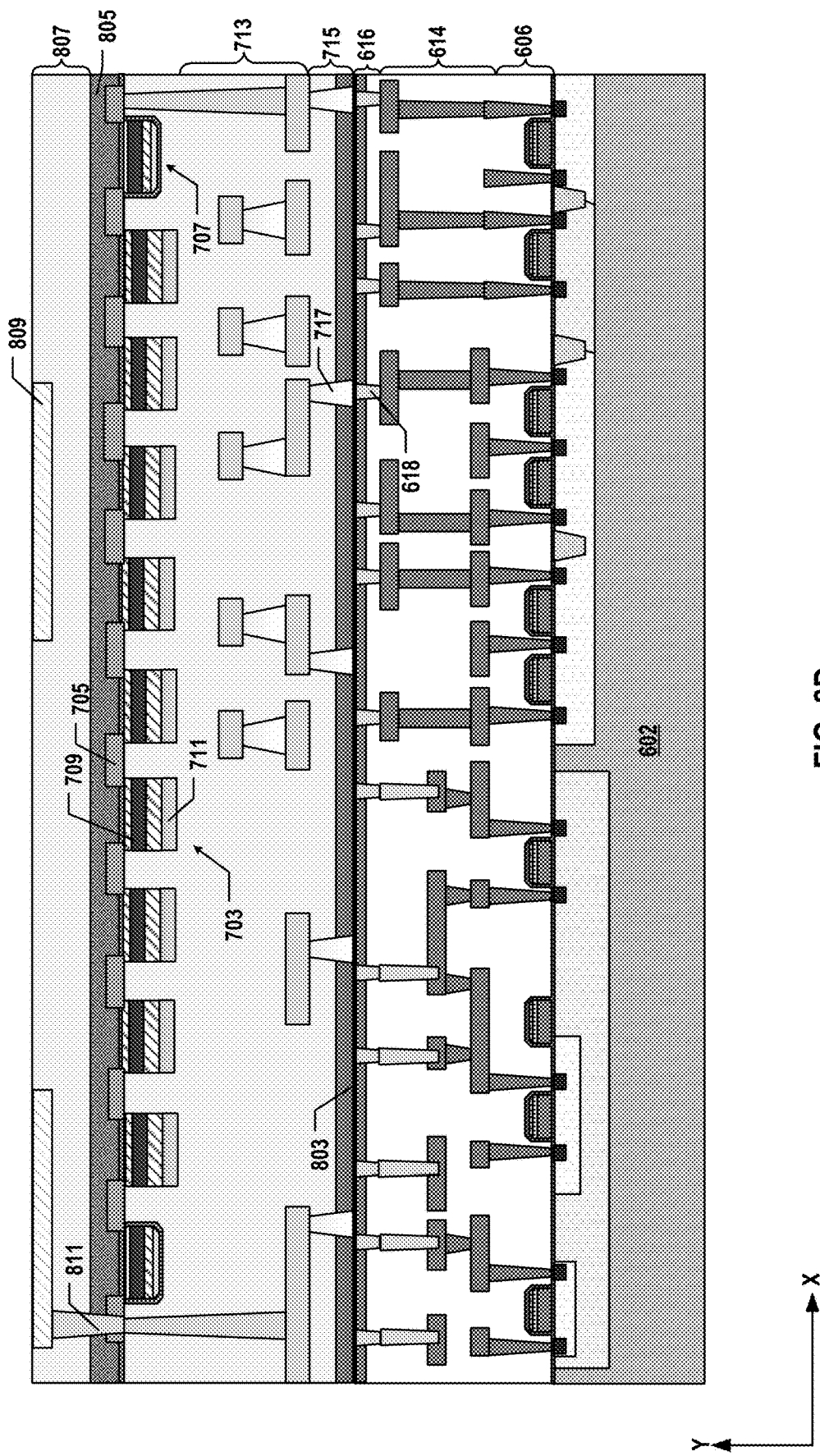
Figure 9A:
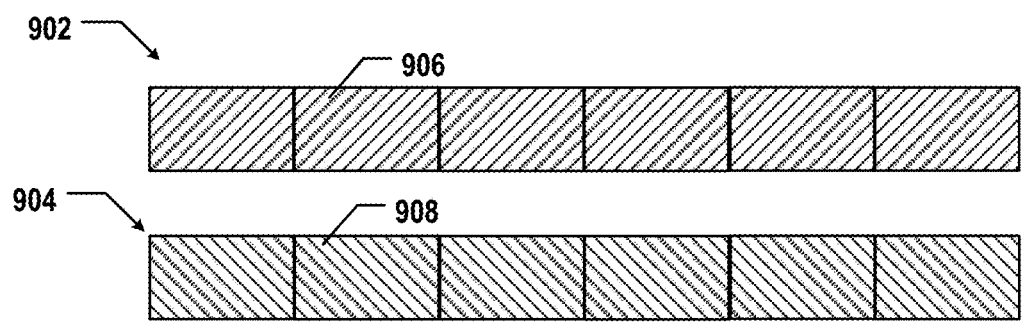
FIGS. 9A-9C illustrate a fabrication process for bonding and dicing an exemplary semiconductor structure, according to some embodiments.
Figure 9B:
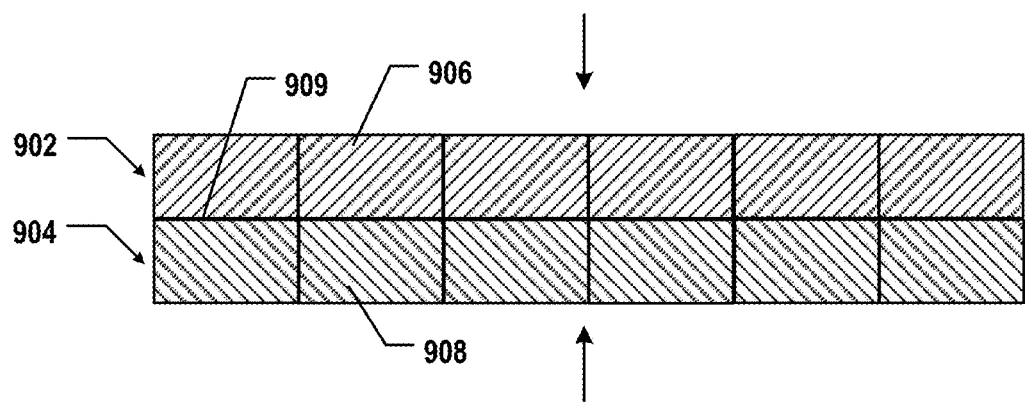
Figure 9C:
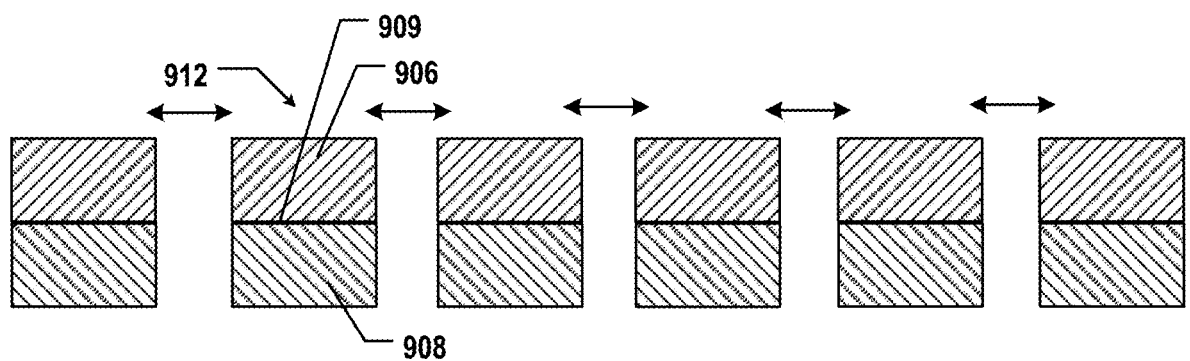
Figure 10A:
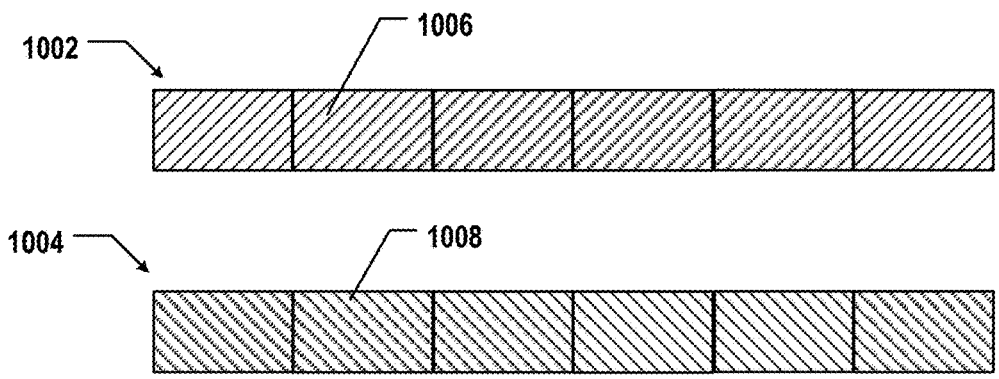
FIGS. 10A-10C illustrate a fabrication process for dicing and bonding an exemplary semiconductor structure, according to some embodiments.
Figure 10B:
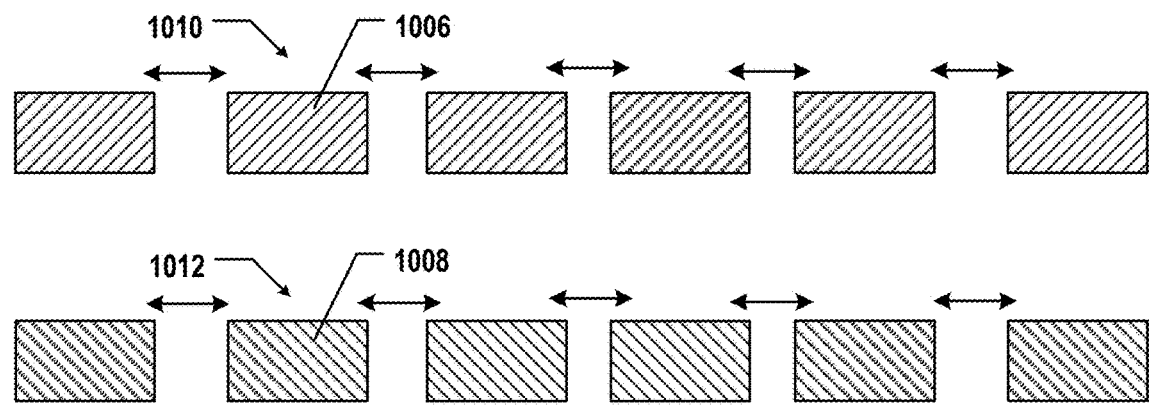
Figure 10C:
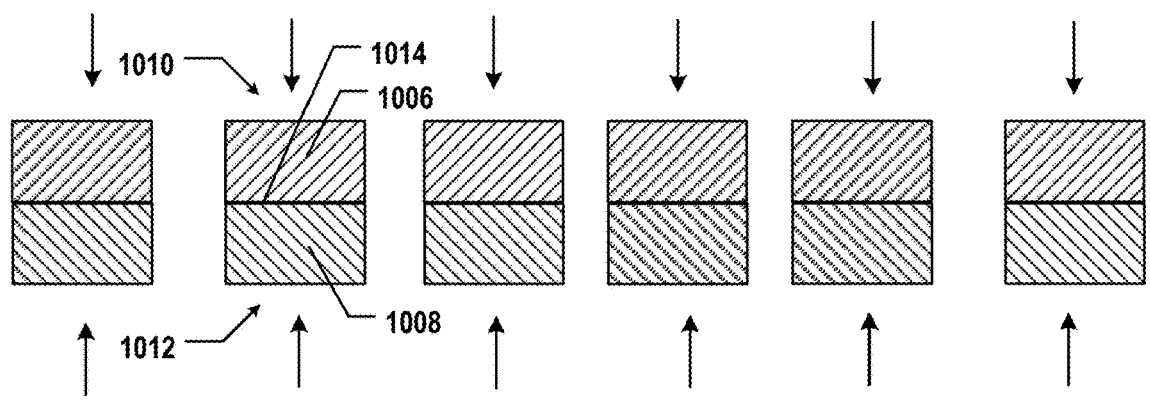
Figure 13:
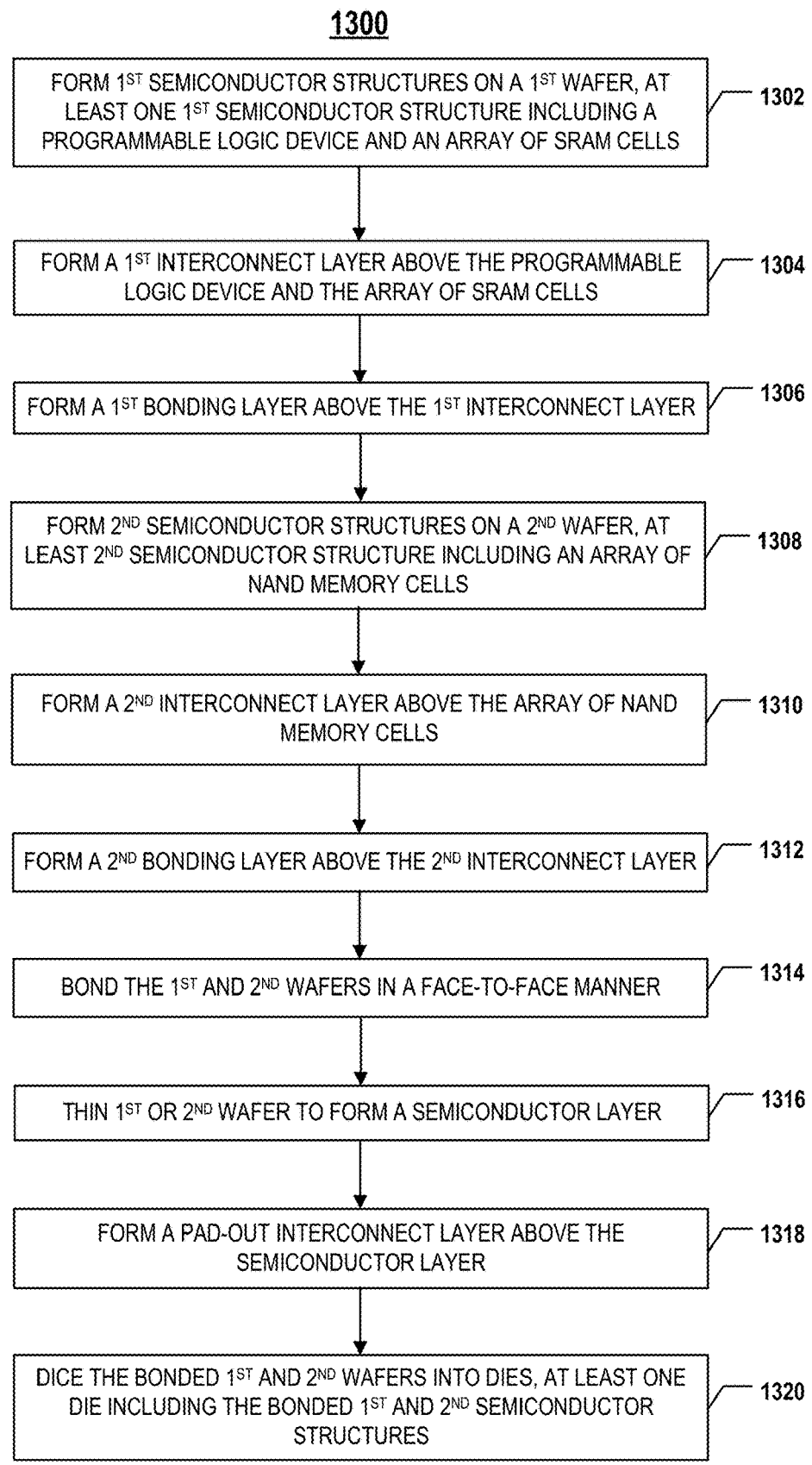
FIG. 13 is a flowchart of an exemplary method for forming a semiconductor device, according to some embodiments.
Figure 14:
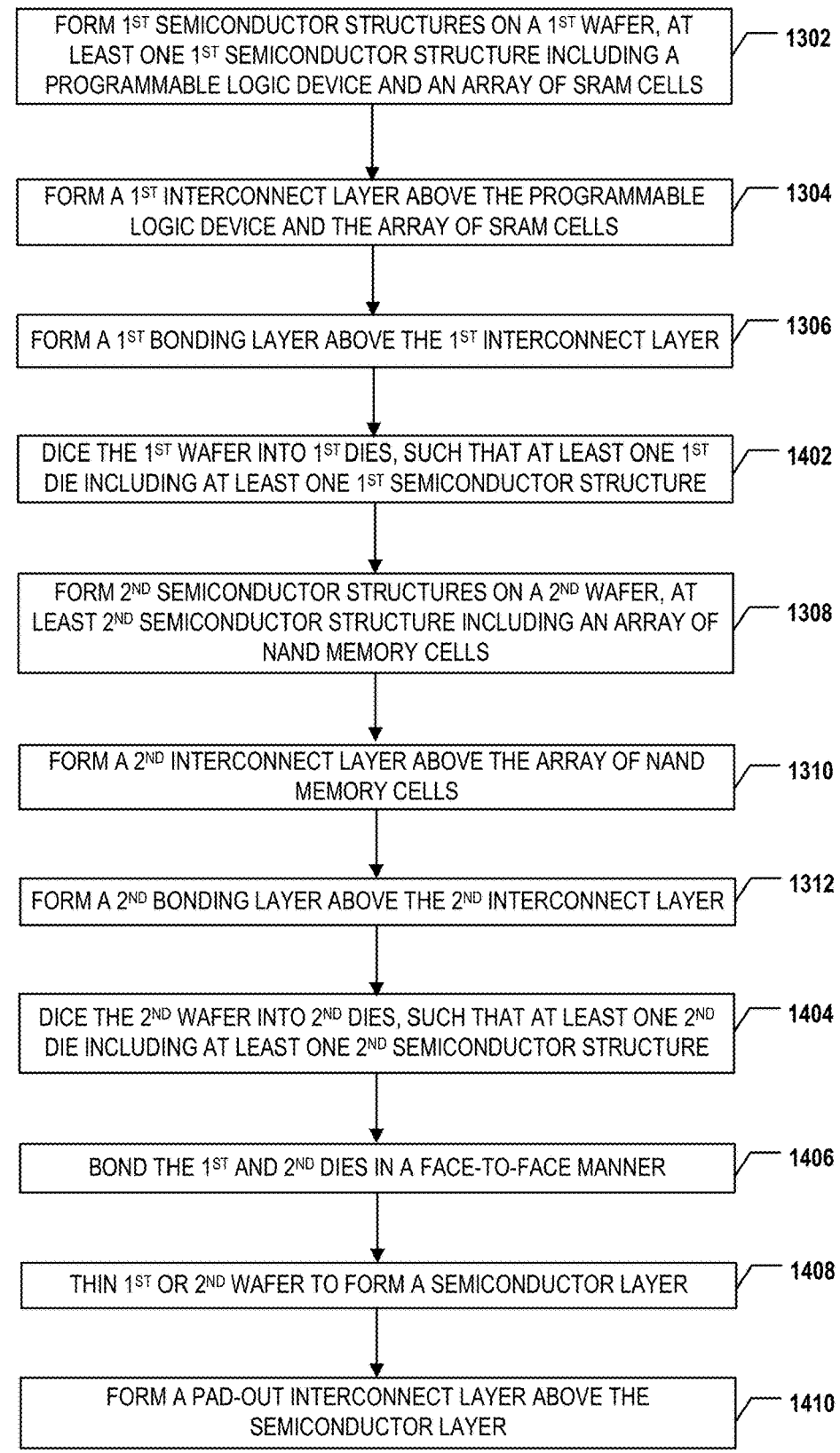
FIG. 14 is a flowchart of another exemplary method for forming a semiconductor device, according to some embodiments.

FIGS. 6A and 6B illustrate a fabrication process for forming an exemplary semiconductor structure having a programmable logic device, SRAM, and peripheral circuits, according to some embodiments. FIGS. 7A and 7B illustrate a fabrication process for forming an exemplary semiconductor structure having 3D NAND memory strings, according to some embodiments. FIGS. 7C and 7D illustrate a fabrication process for forming an exemplary semiconductor structure having 2D NAND memory cells, according to some embodiments. FIGS. 8A and 8B illustrate a fabrication process for forming an exemplary semiconductor device, according to some embodiments. FIGS. 8C and 8D illustrate a fabrication process for forming another exemplary semiconductor device, according to some embodiments. FIGS. 9A-9C illustrate a fabrication process for bonding and dicing an exemplary semiconductor structure, according to some embodiments. FIGS. 10A-10C illustrate a fabrication process for dicing and bonding an exemplary semiconductor structure, according to some embodiments. FIG. 13 is a flowchart of an exemplary method 1300 for forming a semiconductor device, according to some embodiments. FIG. 14 is a flowchart of another exemplary method 1400 for forming a semiconductor device, according to some embodiments. Examples of the semiconductor device depicted in FIGS. 6A, 6B, 7A-7D, 8A, 8B, 9A-9C, 10A-10C, 13, and 14 include semiconductor devices 400, 401, 500, and 501 depicted in FIGS. 4A, 4B, 5A, and 5B, respectively. FIGS. 6A, 6B, 7A-7D, 8A, 8B, 9A-9C, 10A-10C, 13, and 14 will be described together. It is understood that the operations shown in methods 1300 and 1400 are not exhaustive and that other operations can be performed as well before, after, or between any of the illustrated operations. Further, some of the operations may be performed simultaneously, or in a different order than shown in FIGS. 13 and 14.

As depicted in FIGS. 6A and 6B, a first semiconductor structure including a programmable logic device, an array of SRAM cells, a peripheral circuit, and a first bonding layer including a plurality of first bonding contacts is formed. As depicted in FIGS. 7A and 7B, a second semiconductor structure including an array of 3D NAND memory strings and a second bonding layer including a plurality of second bonding contacts is formed. As depicted in FIGS. 8A and 8B, the first semiconductor structure and the second semiconductor structure are bonded in a face-to-face manner, such that the first bonding contacts are in contact with the second bonding contacts at a bonding interface.

Referring to FIG. 13, method 1300 starts at operation 1302, in which a plurality of first semiconductor structures are formed on a first wafer. At least one of the first semiconductor structures includes a programmable logic device, an array of SRAM cells, and a first bonding layer including a plurality of first bonding contacts. The first wafer can be a silicon wafer. In some embodiments, to form the plurality of first semiconductor structures, the programmable logic device and the array of SRAM cells are formed on the first wafer, a first interconnect layer is formed above the programmable logic device and the array of SRAM cells, and the first bonding layer is formed above the first interconnect layer. In some embodiments, to form the programmable logic device and the array of SRAM cells, a plurality of transistors are formed on the first wafer. In some embodiments, to form the plurality of first semiconductor structures, a peripheral circuit of an array of NAND memory cells is also formed on the first wafer.

As illustrated in FIG. 9A, a plurality of first semiconductor structures 906 are formed on a first wafer 902. First wafer 902 can include a plurality of shots separated by scribing lines. Each shot of first wafer 902 includes one or more first semiconductor structures 906, according to some embodiments. FIGS. 6A and 6B illustrate one example of the formation of first semiconductor structure 906.

As illustrated in FIG. 6A, a plurality of transistors 604 are formed on a silicon substrate 602 (as part of first wafer 902, e.g., a silicon wafer). Transistors 604 can be formed by a plurality of processes including, but not limited to, photolithography, dry/wet etch, thin film deposition, thermal growth, implantation, chemical mechanical polishing (CMP), and any other suitable processes. In some embodiments, doped regions are formed in silicon substrate 602 by ion implantation and/or thermal diffusion, which function, for example, as source regions and/or drain regions of transistors 604. In some embodiments, isolation regions (e.g., STIs) are also formed in silicon substrate 602 by wet/dry etch and thin film deposition. Transistors 604 can form a device layer 606 on silicon substrate 602. In some embodiments, device layer 606 includes a programmable logic device 608, an array of SRAM cells 610, and a peripheral circuit 612.

Method 1300 proceeds to operation 1304, as illustrated in FIG. 13, in which a first interconnect layer is formed above the programmable logic device and the array of SRAM cells. The first interconnect layer can include a first plurality of interconnects in one or more ILD layers. As illustrated in FIG. 6B, an interconnect layer 614 can be formed above device layer 606 including programmable logic device 608 and array of SRAM cells 610. Interconnect layer 614 can include interconnects of MEOL and/or BEOL in a plurality of ILD layers to make electrical connections with device layer 606. In some embodiments, interconnect layer 614 includes multiple ILD layers and interconnects therein formed in multiple processes. For example, the interconnects in interconnect layers 614 can include conductive materials deposited by one or more thin film deposition processes including, but not limited to, chemical vapor deposition (CVD), physical vapor deposition (PVD), atomic layer deposition (ALD), electroplating, electroless plating, or any combination thereof. Fabrication processes to form the interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 6B can be collectively referred to as interconnect layer 614.

Method 1300 proceeds to operation 1306, as illustrated in FIG. 13, in which a first bonding layer is formed above the first interconnect layer. The first bonding layer can include a plurality of first bonding contacts. As illustrated in FIG.

6B, a bonding layer 616 is formed above interconnect layer 614. Bonding layer 616 can include a plurality of bonding contacts 618 surrounded by dielectrics. In some embodiments, a dielectric layer is deposited on the top surface of interconnect layer 614 by one or more thin film deposition processes including, but not limited to, CVD, PVD, ALD, or any combination thereof. Bonding contacts 618 then can be formed through the dielectric layer and in contact with the interconnects in interconnect layer 614 by first patterning contact holes through the dielectric layer using a patterning process (e.g., photolithography and dry/wet etch of dielectric materials in the dielectric layer). The contact holes can be filled with a conductor (e.g., copper). In some embodiments, filling the contact holes includes depositing a barrier layer, an adhesion layer, and/or a seed layer before depositing the conductor.

Method 1300 proceeds to operation 1308, as illustrated in FIG. 13, in which a plurality of second semiconductor structures are formed on a second wafer. At least one of the second semiconductor structures includes an array of NAND memory cells and a second bonding layer including a plurality of second bonding contacts. The second wafer can be a silicon wafer. As illustrated in FIG. 9A, a plurality of second semiconductor structures 908 are formed on a second wafer 904. Second wafer 904 can include a plurality of shots separated by scribing lines. Each shot of second wafer 904 includes one or more second semiconductor structures 908, according to some embodiments. FIGS. 7A and 7B illustrate one example of the formation of second semiconductor structure 908. FIGS. 7C and 7D illustrate another example of the formation of second semiconductor structure 908.

In some embodiments, to form the plurality of second semiconductor structures, a memory stack is formed above the second wafer, and an array of 3D NAND memory strings extending vertically through the memory stack are formed. As illustrated in FIG. 7A, interleaved sacrificial layers (not shown) and dielectric layers 708 are formed above a silicon substrate 702. The interleaved sacrificial layers and dielectric layers 708 can form a dielectric stack (not shown). In some embodiments, each sacrificial layer includes a layer of silicon nitride, and each dielectric layer 708 includes a layer of silicon oxide. The interleaved sacrificial layers and dielectric layers 708 can be formed by one or more thin film deposition processes including, but not limited to, CVD, PVD, ALD, or any combination thereof. In some embodiments, a memory stack 704 can be formed by a gate replacement process, e.g., replacing the sacrificial layers with conductor layers 706 using wet/dry etch of the sacrificial layers selective to dielectric layers 708 and filling the resulting recesses with conductor layers 706. As a result, memory stack 704 can include interleaved conductor layers 706 and dielectric layers 708. In some embodiments, each conductor layer 706 includes a metal layer, such as a layer of tungsten. It is understood that memory stack 704 may be formed by alternatingly depositing conductor layers (e.g., doped polysilicon layers) and dielectric layers (e.g., silicon oxide layers) without the gate replacement process in other embodiments. In some embodiments, a pad oxide layer including silicon oxide is formed between memory stack 704 and silicon substrate 702.

As illustrated in FIG. 7A, 3D NAND memory strings 710 are formed above silicon substrate 702, each of which extends vertically through interleaved conductor layers 706 and dielectric layers 708 of memory stack 704. In some embodiments, fabrication processes to form 3D NAND memory string 710 include forming a channel hole through memory stack 704 and into silicon substrate 702 using dry etching/and or wet etching, such as deep reactive-ion etching (DRIE), followed by epitaxially growing a plug 712 in the lower portion of the channel hole from silicon substrate 702. In some embodiments, fabrication processes to form 3D NAND memory string 710 also include subsequently filling the channel hole with a plurality of layers, such as a memory film 714 (e.g., a tunneling layer, a storage layer, and a blocking layer) and a semiconductor layer 716, using thin film deposition processes such as ALD, CVD, PVD, or any combination thereof. In some embodiments, fabrication processes to form 3D NAND memory string 710 further include forming another plug 718 in the upper portion of the channel hole by etching a recess at the upper end of 3D NAND memory string 710, followed by filling the recess with a semiconductor material using thin film deposition processes such as ALD, CVD, PVD, or any combination thereof.

In some embodiments, to form the plurality of second semiconductor structures, an array of 2D NAND memory cells are formed on the second wafer. As illustrated in FIG. 7C, 2D NAND memory cells 703 are formed on silicon substrate 702 in the form of 2D NAND memory strings, each of which includes a plurality of memory cells connected in series by sources/drains 705 (resembling a NAND gate) and two select transistors 707 at the ends of the 2D NAND memory string, respectively. 2D NAND memory cells 703 and select transistors 707 can be formed by a plurality of processes including, but not limited to, photolithography, dry/wet etch, thin film deposition, thermal growth, implantation, CMP, and any other suitable processes. In some embodiments, doped regions are formed in silicon substrate 702 by ion implantation and/or thermal diffusion, which function, for example, as sources/drains 705. In some embodiments, isolation regions (e.g., STIs, not shown) are also formed in silicon substrate 702 by wet/dry etch and thin film deposition.

In some embodiments, a gate stack is formed for each 2D NAND memory cell 703. The gate stack can include a tunneling layer, a floating gate 709, a blocking layer, and a control gate 711 from bottom to top in this order for "floating gate" type of 2D NAND memory cells 703. In some embodiments, floating gate 709 is replaced by a storage layer for "charge trap" type of 2D NAND memory cells. The tunneling layer, floating gate 709 (or storage layer), blocking layer, and control gate 711 of the gate stack can be formed by one or more thin film deposition processes including, but not limited to, CVD, PVD, ALD, electroplating, electroless plating, or any combination thereof.

Method 1300 proceeds to operation 1310, as illustrated in FIG. 13, in which a second interconnect layer is formed above the array of NAND memory cells. The second interconnect layer can include a second plurality of interconnects in one or more ILD layers.

In some embodiments, the second interconnect layer is formed above the memory stack and the array of 3D NAND memory strings. As illustrated in FIG. 7B, an interconnect layer 720 can be formed above memory stack 704 and array of 3D NAND memory strings 710. Interconnect layer 720 can include interconnects of MEOL and/or BEOL in a plurality of ILD layers to make electrical connections with array of 3D NAND memory strings 710. In some embodiments, interconnect layer 720 includes multiple ILD layers and interconnects therein formed in multiple processes. For example, the interconnects in interconnect layers 720 can include conductive materials deposited by one or more thin film deposition processes including, but not limited to, CVD, PVD, ALD, electroplating, electroless plating, or any combination thereof. Fabrication processes to form the interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 7B can be collectively referred to as interconnect layer 720.

In some embodiments, the second interconnect layer is formed above the array of 2D NAND memory cells. As illustrated in FIG. 7D, an interconnect layer 713 can be formed above array of 2D NAND memory cells 703. Interconnect layer 713 can include interconnects of MEOL and/or BEOL in a plurality of ILD layers to make electrical connections with array of 2D NAND memory cells 703. In some embodiments, interconnect layer 713 includes multiple ILD layers and interconnects therein formed in multiple processes. For example, the interconnects in interconnect layers 713 can include conductive materials deposited by one or more thin film deposition processes including, but not limited to, CVD, PVD, ALD, electroplating, electroless plating, or any combination thereof. Fabrication processes to form the interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 7D can be collectively referred to as interconnect layer 713.

Method 1300 proceeds to operation 1312, as illustrated in FIG. 13, in which a second bonding layer is formed above the second interconnect layer. The second bonding layer can include a plurality of second bonding contacts. As illustrated in FIG. 7B, a bonding layer 722 is formed above interconnect layer 720. Bonding layer 722 can include a plurality of bonding contacts 724 surrounded by dielectrics. In some embodiments, a dielectric layer is deposited on the top surface of interconnect layer 720 by one or more thin film deposition processes including, but not limited to, CVD, PVD, ALD, or any combination thereof. Bonding contacts 724 then can be formed through the dielectric layer and in contact with the interconnects in interconnect layer 720 by first patterning contact holes through the dielectric layer using a patterning process (e.g., photolithography and dry/wet etch of dielectric materials in the dielectric layer). The contact holes can be filled with a conductor (e.g., copper). In some embodiments, filling the contact holes includes depositing an adhesion (glue) layer, a barrier layer, and/or a seed layer before depositing the conductor.

Similarly, as illustrated in FIG. 7D, a bonding layer 715 is formed above interconnect layer 713. Bonding layer 715 can include a plurality of bonding contacts 717 surrounded by dielectrics. In some embodiments, a dielectric layer is deposited on the top surface of interconnect layer 713 by one or more thin film deposition processes including, but not limited to, CVD, PVD, ALD, or any combination thereof. Bonding contacts 717 then can be formed through the dielectric layer and in contact with the interconnects in interconnect layer 713 by first patterning contact holes through the dielectric layer using a patterning process (e.g., photolithography and dry/wet etch of dielectric materials in the dielectric layer). The contact holes can be filled with a conductor (e.g., copper). In some embodiments, filling the contact holes includes depositing an adhesion (glue) layer, a barrier layer, and/or a seed layer before depositing the conductor.

Method 1300 proceeds to operation 1314, as illustrated in FIG. 13, in which the first wafer and the second wafer are bonded in a face-to-face manner, such that the at least one of the first semiconductor structures is bonded to the at least one of the second semiconductor structures. The first bonding contacts of the first semiconductor structure are in contact with the second bonding contacts of the second semiconductor structure at a bonding interface. The bonding can be hybrid bonding. In some embodiments, the second semiconductor structure is above the first semiconductor structure after the bonding. In some embodiments, the first semiconductor structure is above the second semiconductor structure after the bonding.

As illustrated in FIG. 9B, first wafer 902 and second wafer 904 are bonded in a face-to-face manner, such that at least one of first semiconductor structures 906 is bonded to at least one of second semiconductor structures 908 at a bonding interface 909. Although first wafer 902 is above second wafer 904 after the bonding as shown in FIG. 9B, it is understood that second wafer 904 may be above first wafer 902 after the bonding in some embodiments. FIG. 8A illustrates one example of the formation of bonded first and second semiconductor structures 906 and 908. FIG. 8C illustrates another example of the formation of bonded first and second semiconductor structures 906 and 908.

As illustrated in FIG. 8A, silicon substrate 702 and components formed thereon (e.g., memory stack 704 and array of 3D NAND memory strings 710 formed therethrough) are flipped upside down. Bonding layer 722 facing down is bonded with bonding layer 616 facing up, i.e., in a face-to-face manner, thereby forming a bonding interface 802 (as shown in FIG. 8B). In some embodiments, a treatment process, e.g., a plasma treatment, a wet treatment, and/or a thermal treatment, is applied to the bonding surfaces prior to the bonding. Although not shown in FIG. 8A, silicon substrate 602 and components formed thereon (e.g., device layer 606 including programmable logic device 608, array of SRAM cells 610, and peripheral circuit 612) can be flipped upside down, and bonding layer 616 facing down can be bonded with bonding layer 722 facing up, i.e., in a face-to-face manner, thereby forming bonding interface 802. After the bonding, bonding contacts 724 in bonding layer 722 and bonding contacts 618 in bonding layer 616 are aligned and in contact with one another, such that memory stack 704 and array of 3D NAND memory strings 710 formed therethrough can be electrically connected to device layer 606 (e.g., programmable logic device 608, array of SRAM cells 610, and peripheral circuit 612 therein). It is understood that in the bonded chip, device layer 606 (e.g., programmable logic device 608, array of SRAM cells 610, and peripheral circuit 612 therein) may be either above or below memory stack 704 and array of 3D NAND memory strings 710 formed therethrough. Nevertheless, bonding interface 802 can be formed between device layer 606 (e.g., programmable logic device 608, array of SRAM cells 610, and peripheral circuit 612 therein) and memory stack 704 (and array of 3D NAND memory strings 710 formed therethrough) after the bonding as illustrated in FIG. 8B.

Similarly, as illustrated in FIG. 8C, silicon substrate 702 and components formed thereon (e.g., array of 2D NAND memory cells 703) are flipped upside down. Bonding layer 715 facing down is bonded with bonding layer 616 facing up, i.e., in a face-to-face manner, thereby forming a bonding interface 803 (as shown in FIG. 8D). In some embodiments, one or more treatment processes, e.g., plasma treatment, wet treatment, and/or thermal treatment, are applied to the bonding surfaces prior to the bonding. Although not shown in FIG. 8C, silicon substrate 602 and components formed thereon (e.g., device layer 606 including programmable logic device 608, array of SRAM cells 610, and peripheral circuit 612) can be flipped upside down, and bonding layer 616 facing down can be bonded with bonding layer 715 facing up, i.e., in a face-to-face manner, thereby forming bonding interface 803. After the bonding, bonding contacts 717 in bonding layer 715 and bonding contacts 618 in bonding layer 616 are aligned and in contact with one another, such that array of 2D NAND memory cells 703 can be electrically connected to device layer 606 (e.g., programmable logic device 608, array of SRAM cells 610, and peripheral circuit 612 therein). It is understood that in the bonded chip, device layer 606 (e.g., programmable logic device 608, array of SRAM cells 610, and peripheral circuit 612 therein) may be either above or below array of 2D NAND memory cells 703. Nevertheless, bonding interface 803 can be formed between device layer 606 (e.g., programmable logic device 608, array of SRAM cells 610, and peripheral circuit 612 therein) and array of 2D NAND memory cells 703 after the bonding as illustrated in FIG. 8C.

Method 1300 proceeds to operation 1316, as illustrated in FIG. 13, in which the first wafer or the second wafer is thinned to form a semiconductor layer. In some embodiments, the first wafer of the first semiconductor structure, which is above the second wafer of the second semiconductor structure after the bonding, is thinned to form the semiconductor layer. In some embodiments, the second wafer of the second semiconductor structure, which is above the first wafer of the first semiconductor structure after the bonding, is thinned to form the semiconductor layer.

As illustrated in FIG. 8B, the substrate at the top of the bonded chip (e.g., silicon substrate 702 as shown in FIG. 8A) is thinned, so that the thinned top substrate can serve as a semiconductor layer 804, for example, a single-crystal silicon layer or a polysilicon layer. Similarly, as illustrated in FIG. 8D, the substrate at the top of the bonded chip (e.g., silicon substrate 702 as shown in FIG. 8C) is thinned, so that the thinned top substrate can serve as a semiconductor layer 805, for example, a single-crystal silicon layer. In one example, the thickness of the thinned substrate may be between about 1 μm and about 20 μm, such as between 1 μm and 20 μm (e.g., 1 μm, 2 μm, 3 μm, 4 μm, 5 μm, 6 μm, 7 μm, 8 μm, 9 μm, 10 μm, 15 μm, 20 μm, any range bounded by the lower end by any of these values, or in any range defined by any two of these values), for example, using a combination of etch and CMP processes. It is understood that in some embodiments, by further applying an additional etch process, the thickness of the thinned substrate may be further reduced to below 1 μm, e.g., in the sub-micron range. It is understood that when silicon substrate 602 is the substrate at the top of the bonded chip, another semiconductor layer may be formed by thinning silicon substrate 602.

Method 1300 proceeds to operation 1318, as illustrated in FIG. 13, in which a pad-out interconnect layer is formed above the semiconductor layer. As illustrated in FIG. 8B, a pad-out interconnect layer 806 is formed above semiconductor layer 804 (the thinned top substrate). Pad-out interconnect layer 806 can include interconnects, such as pad contacts 808, formed in one or more ILD layers. Pad contacts 808 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. In some embodiments, after the bonding and thinning, contacts 810 are formed extending vertically through semiconductor layer 804, for example by wet/dry etch followed by depositing conductive materials. Contacts 810 can be in contact with the interconnects in pad-out interconnect layer 806.

Similarly, as illustrated in FIG. 8D, a pad-out interconnect layer 807 is formed above semiconductor layer 805 (the thinned top substrate). Pad-out interconnect layer 807 can include interconnects, such as pad contacts 809, formed in one or more ILD layers. Pad contacts 809 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. In some embodiments, after the bonding and thinning, contacts 811 are formed extending vertically through semiconductor layer 805, for example by wet/dry etch followed by depositing conductive materials. Contacts 811 can be in contact with the interconnects in pad-out interconnect layer 807.

Method 1300 proceeds to operation 1320, as illustrated in FIG. 13, in which the bonded first and second wafers are diced into a plurality of dies. At least one of the dies includes the bonded first and second semiconductor structures. As illustrated in FIG. 9C, bonded first and second wafers 902 and 904 (as shown in FIG. 9B) are diced into a plurality of dies 912. At least one of dies 912 includes bonded first and second semiconductor structures 906 and 908. In some embodiments, each shot of bonded first and second wafers 902 and 904 is cut from bonded first and second wafers 902 and 904 along the scribing lines using wafer laser dicing and/or mechanical dicing techniques, thereby becoming respective die 912. Die 912 can include bonded first and second semiconductor structures 906 and 908, for example, the bonded structure as shown in FIG. 8B or 8D.

Instead of packaging scheme based on wafer-level bonding before dicing as described above with respect to FIGS. 9A-9C and 13, FIGS. 10A-10C and 14 illustrate another packaging scheme based on die-level bonding after dicing, according to some embodiments. Operations 1302, 1304, and 1306 of method 1300 in FIG. 13 are described above with respect to method 1300 in FIG. 13 and thus, are not repeated. As illustrated in FIG. 10A, a plurality of first semiconductor structures 1006 are formed on a first wafer 1002. First wafer 1002 can include a plurality of shots separated by scribing lines. Each shot of first wafer 1002 includes one or more first semiconductor structures 1006, according to some embodiments. FIGS. 6A and 6B illustrate one example of the formation of first semiconductor structure 1006.

Method 1400 proceeds to operation 1402, as illustrated in FIG. 14, in which the first wafer is diced into a plurality of first dies, such that at least one of the first dies includes the at least one of the first semiconductor structures. As illustrated in FIG. 10B, first wafer 1002 (as shown in FIG. 10A) is diced into a plurality of dies 1010, such that at least one die 1010 includes first semiconductor structure 1006. In some embodiments, each shot of first wafer 1002 is cut from first wafer 1002 along the scribing lines using wafer laser dicing and/or mechanical dicing techniques, thereby becoming respective die 1010. Die 1010 can include first semiconductor structure 1006, for example, the structure as shown in FIG. 6B.

Operations 1308, 1310, and 1312 of method 1300 in FIG. 13 are described above with respect to method 1300 in FIG. 13 and thus, are not repeated. As illustrated in FIG. 10A, a plurality of second semiconductor structures 1008 are formed on a second wafer 1004. Second wafer 1004 can include a plurality of shots separated by scribing lines. Each shot of second wafer 1004 includes one or more second semiconductor structures 1008, according to some embodiments. FIGS. 7A and 7B illustrate one example of the formation of second semiconductor structure 1008. FIGS. 7C and 7D illustrate another example of the formation of second semiconductor structure 1008.

Method 1400 proceeds to operation 1404, as illustrated in FIG. 14, in which the second wafer is diced into a plurality of second dies, such that at least one of the second dies includes the at least one of the second semiconductor structures. As illustrated in FIG. 10B, second wafer 1004 (as shown in FIG. 10A) is diced into a plurality of dies 1012, such that at least one die 1012 includes second semiconductor structure 1008. In some embodiments, each shot of second wafer 1004 is cut from second wafer 1004 along the scribing lines using wafer laser dicing and/or mechanical dicing techniques, thereby becoming respective die 1012. Die 1012 can include second semiconductor structure 1008, for example, the structure as shown in FIG. 7C or 7D.

Method 1400 proceeds to operation 1406, as illustrated in FIG. 14, in which the first die and the second die are bonded in a face-to-face manner, such that the first semiconductor structure is bonded to the second semiconductor structure. The first bonding contacts of the first semiconductor structure are in contact with the second bonding contacts of the second semiconductor structure at a bonding interface. As illustrated in FIG. 10C, die 1010 including first semiconductor structure 1006 and die 1012 including second semiconductor structure 1008 are bonded in a face-to-face manner, such that first semiconductor structure 1006 is bonded to second semiconductor structure 1008 at a bonding interface 1014. Although first semiconductor structure 1006 is above second semiconductor structure 1008 after the bonding as shown in FIG. 10C, it is understood that second semiconductor structure 1008 may be above first semiconductor structure 1006 after the bonding in some embodiments. FIG. 8A illustrates one example of the formation of bonded first and second semiconductor structures 1006 and 1008. FIG. 8B illustrates another example of the formation of bonded first and second semiconductor structures 1006 and 1008.

Method 1400 proceeds to operation 1408, as illustrated in FIG. 14, in which the first wafer or the second wafer is thinned to form a semiconductor layer. In some embodiments, the first wafer of the first semiconductor structure, which is above the second wafer of the second semiconductor structure after the bonding, is thinned to form the semiconductor layer. In some embodiments, the second wafer of the second semiconductor structure, which is above the first wafer of the first semiconductor structure after the bonding, is thinned to form the semiconductor layer.

As illustrated in FIG. 8B, the substrate at the top of the bonded chip (e.g., silicon substrate 702 as shown in FIG. 8A) is thinned, so that the thinned top substrate can serve as a semiconductor layer 804, for example, a single-crystal silicon layer or a polysilicon layer. Similarly, as illustrated in FIG. 8D, the substrate at the top of the bonded chip (e.g., silicon substrate 702 as shown in FIG. 8C) is thinned, so that the thinned top substrate can serve as a semiconductor layer 805, for example, a single-crystal silicon layer. In one example, the thickness of the thinned substrate may be between about 1 μm and about 20 μm, such as between 1 μm and 20 μm (e.g., 1 μm, 2 μm, 3 μm, 4 μm, 5 μm, 6 μm, 7 μm, 8 μm, 9 μm, 10 μm, 15 μm, 20 μm, any range bounded by the lower end by any of these values, or in any range defined by any two of these values), for example, using a combination of etch and CMP processes. It is understood that in some embodiments, by further applying an additional etch process, the thickness of the thinned substrate may be further reduced to below 1 μm, e.g., in the sub-micron range. It is understood that when silicon substrate 602 is the substrate at the top of the bonded chip, another semiconductor layer may be formed by thinning silicon substrate 602.

Method 1400 proceeds to operation 1410, as illustrated in FIG. 14, in which a pad-out interconnect layer is formed above the semiconductor layer. As illustrated in FIG. 8B, a pad-out interconnect layer 806 is formed above semiconductor layer 804 (the thinned top substrate). Pad-out interconnect layer 806 can include interconnects, such as pad contacts 808, formed in one or more ILD layers. Pad contacts 808 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. In some embodiments, after the bonding and thinning, contacts 810 are formed extending vertically through semiconductor layer 804, for example by wet/dry etch followed by depositing conductive materials. Contacts 810 can be in contact with the interconnects in pad-out interconnect layer 806.

Similarly, as illustrated in FIG. 8D, a pad-out interconnect layer 807 is formed above semiconductor layer 805 (the thinned top substrate). Pad-out interconnect layer 807 can include interconnects, such as pad contacts 809, formed in one or more ILD layers. Pad contacts 809 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. In some embodiments, after the bonding and thinning, contacts 811 are formed extending vertically through semiconductor layer 805, for example by wet/dry etch followed by depositing conductive materials. Contacts 811 can be in contact with the interconnects in pad-out interconnect layer 807.

It is understood that although the first semiconductor structures disclosed above in which a programmable logic device and SRAM are formed (e.g., 402, 405, 502, and 505) each includes the peripheral circuits of the NAND memory (e.g., 416, 439, 516, and 539), in some embodiments, the entirety or part of the peripheral circuits may not be included in the first semiconductor structure in the bonded semiconductor device. It is further understood that although the second semiconductor structures disclosed above in which NAND memory is formed (e.g., 403, 404, 503, and 504) each does not include the peripheral circuits of the NAND memory, in some embodiments, the entirety or part of the peripheral circuits may be included in the first semiconductor structure in the bonded semiconductor device.

Figure 11A:
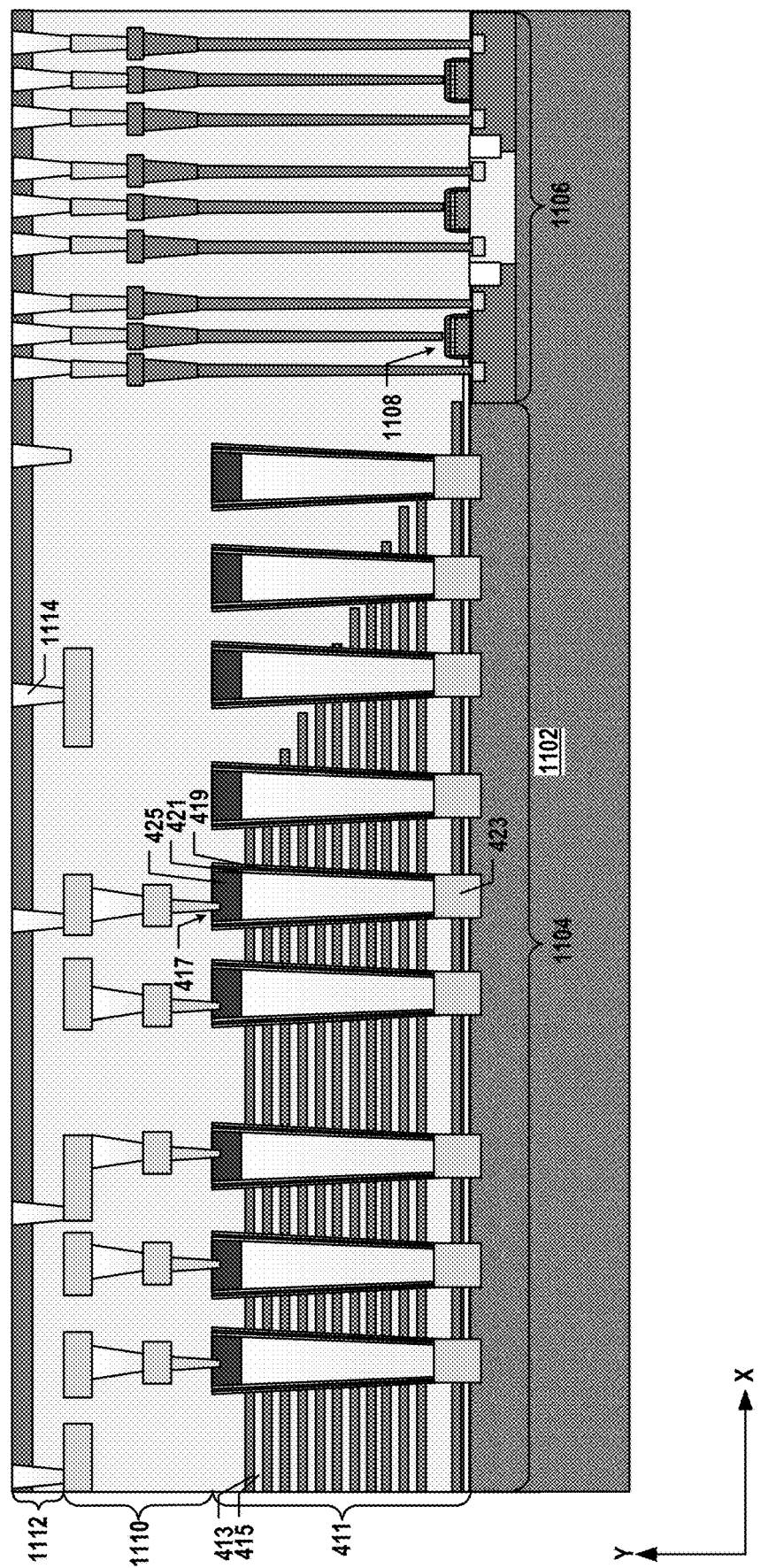
FIG. 11A illustrates a cross-section of an exemplary semiconductor structure having NAND memory and peripheral circuits, according to some embodiments.

FIG. 11A illustrates a cross-section of an exemplary semiconductor structure 1100 having NAND memory and peripheral circuits, according to some embodiments. For illustrative purposes only, a NAND memory 1104 in semiconductor structure 1100 includes array of 3D NAND memory strings 417 extending vertically through memory stack 411 above a substrate 1102 as described above in detail in second semiconductor structure 403 with respect to FIG. 4B. The details of similar structures (e.g., materials, fabrication process, functions, etc.) in both semiconductor structures 403 and 1100 are not repeated. It is understood that NAND memory 1104 may include an array of 2D NAND memory cells (e.g., 536 and 551) in other embodiments.

As illustrated in FIG. 11A, semiconductor structure 1100 further includes a peripheral circuit 1106 formed on substrate 1102 and outside of NAND memory 1104 (e.g., array of 3D NAND memory strings 417). Both NAND memory 1104 and peripheral circuit 1106 of NAND memory 1104 can be formed in the same plane, e.g., on substrate 1102. Peripheral circuit 1106 can be the entirety or part of the peripheral circuits for sensing and controlling NAND memory 1104, including one or more of a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors). In some embodiments, peripheral circuit 1106 includes a plurality of transistors 1108. Transistors 1108 can be formed "on" substrate 1102, in which the entirety or part of transistors 1108 are formed in substrate 1102 (e.g., below the top surface of substrate 1102) and/or directly on substrate 1102. Isolation regions (e.g., STIs) and doped regions (e.g., source regions and drain regions of transistors 1108) can be formed in substrate 1102 as well. Transistors 1108 are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.), according to some embodiments.

In some embodiments, semiconductor structure 1100 also includes an interconnect layer 1110 above NAND memory 1104 (e.g., memory stack 411, 3D NAND memory strings 417) and peripheral circuit 1106 to transfer electrical signals to and from 3D NAND memory strings 417 and peripheral circuit 1106. Interconnect layer 1110 can include a plurality of interconnects, including interconnect lines and via contacts. NAND memory 1104 (e.g., 3D NAND memory strings 417) and peripheral circuit 1106 can be electrically connected by the interconnects in interconnect layer 1110 as well. In some embodiments, semiconductor structure 1100 further includes a bonding layer 1112 above interconnect layer 1110, memory stack 411 (and 3D NAND memory strings 417 therethrough), and peripheral circuit 1106. Bonding layer 1112 can include a plurality of bonding contacts 1114 and dielectrics surrounding and electrically isolating bonding contacts 1114.

Figure 11B:
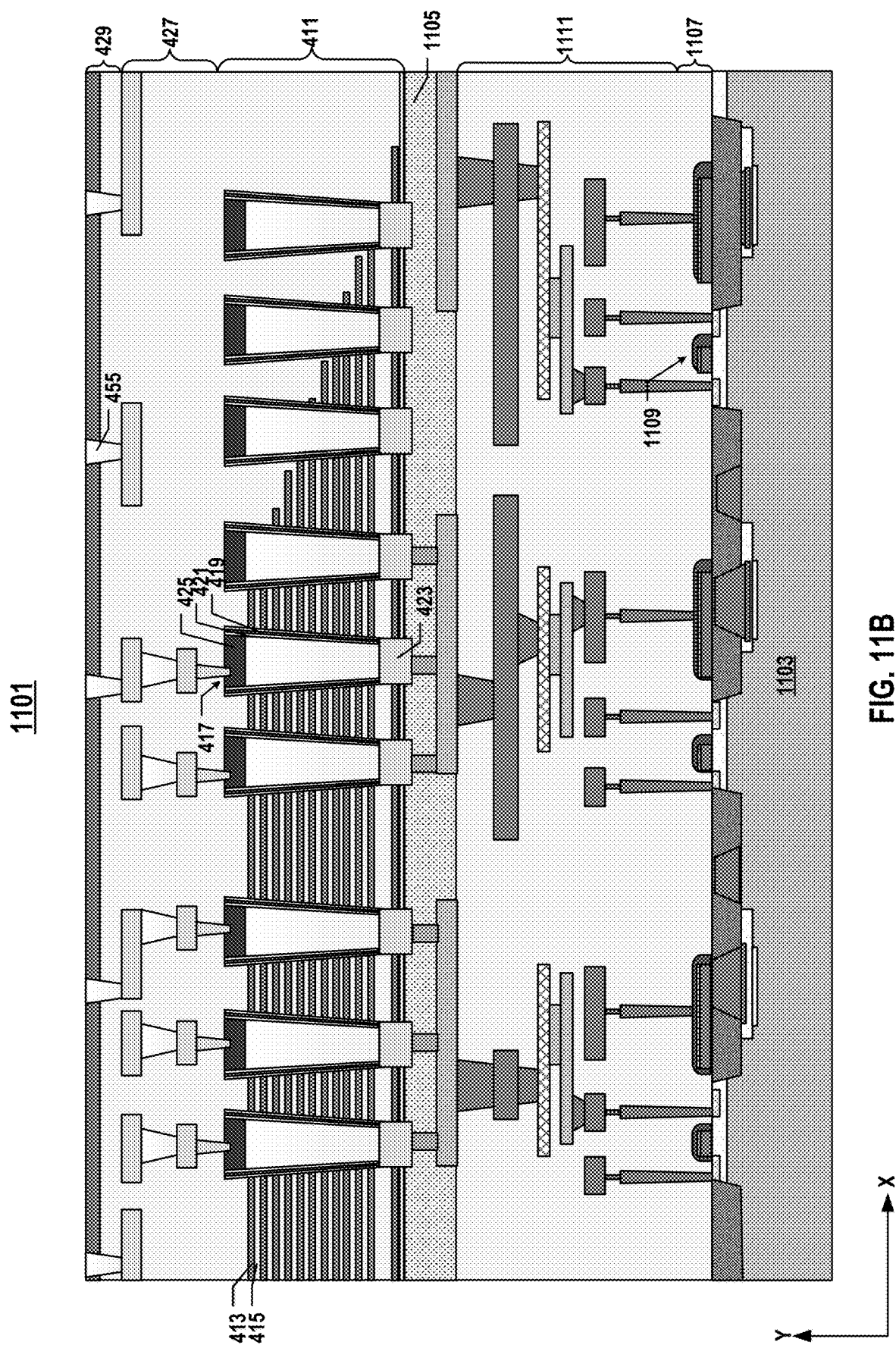
FIG. 11B illustrates a cross-section of another exemplary semiconductor structure having NAND memory and peripheral circuits, according to some embodiments.

The relative positions of the NAND memory and the peripheral circuit of the NAND memory in the same semiconductor structure are not limited to being in the same plane as shown in FIG. 11A. In some embodiments, the peripheral circuit of the NAND memory is above the NAND memory. In some embodiments, the peripheral circuit of the NAND memory is below the NAND memory. FIG. 11B illustrates a cross-section of another exemplary semiconductor structure 1101 having NAND memory and peripheral circuits, according to some embodiments. Semiconductor structure 1101 is similar to semiconductor structure 403, both of which include memory stack 411, array of 3D NAND memory strings 417, interconnect layer 427 above memory stack 411, and bonding layer 429 above interconnect layer 427. The details of similar structures (e.g., materials, fabrication process, functions, etc.) in both semiconductor structures 403 and 1101 are thus not repeated.

Different from semiconductor structure 403, semiconductor structure 1101 further includes a peripheral circuit 1107 below memory stack 411 (and 3D NAND memory strings 417 therethrough) on a substrate 1103. Peripheral circuit 1107 can be the entirety or part of the peripheral circuits for sensing and controlling 3D NAND memory strings 417, including one or more of a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors). In some embodiments, peripheral circuit 1107 includes a plurality of transistors 1109. Transistors 1109 can be formed "on" substrate 1103, in which the entirety or part of transistors 1109 are formed in substrate 1103 (e.g., below the top surface of substrate 1103) and/or directly on substrate 1103. Isolation regions (e.g., STIs) and doped regions (e.g., source regions and drain regions of transistors 1109) can be formed in substrate 1103 as well. Transistors 1109 are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.), according to some embodiments.

In some embodiments, semiconductor structure 1101 also includes an interconnect layer 1111 formed vertically between peripheral circuit 1107 and memory stack 411 (and 3D NAND memory strings 417 therethrough) to electrically connect 3D NAND memory strings 417 and peripheral circuit 1107 for transferring electrical signals between 3D NAND memory strings 417 and peripheral circuit 1107. Interconnect layer 1111 can include a plurality of interconnects, including interconnect lines and via contacts. 3D NAND memory strings 417 and peripheral circuit 1107 can be electrically connected by the interconnects in interconnect layer 1111 as well. In some embodiments, semiconductor structure 1101 further includes a semiconductor layer 1105 above which memory stack 411 (and 3D NAND memory strings 417 therethrough) can be formed. Semiconductor layer 1105 can be a polysilicon layer formed above interconnect layer 1111, for example, by one or more thin film deposition processes. Memory stack 411 then can be formed above semiconductor layer 1105. It is understood that although peripheral circuit 1107 is below memory stack 411 (and 3D NAND memory strings 417 therethrough) as shown in FIG. 11B, in some embodiments, peripheral circuit 1107 may be above memory stack 411 (and 3D NAND memory strings 417 therethrough).

Figure 12A:
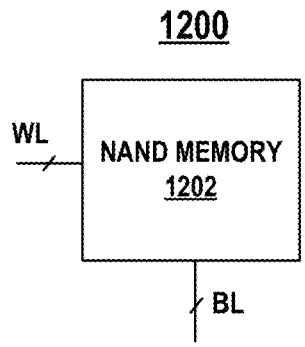
FIG. 12A illustrates a block diagram of an exemplary semiconductor structure having NAND memory, according to some embodiments.

FIG. 12A illustrates a block diagram of an exemplary semiconductor structure 1200 having NAND memory, according to some embodiments. Semiconductor structure 1200 includes NAND memory 1202 but does not include any peripheral circuit of NAND memory 1202. The peripheral circuits of NAND memory 1202 can be formed in another semiconductor structure bonded with semiconductor structure 1200. NAND memory 1202 can exchange data, control, command, and address signals with the peripheral circuits in another semiconductor structure through word lines (WLs) and bit lines (BLs) using a large number of short-distanced bonding contacts across the bonding interface as disclosed above in detail. Examples of semiconductor structure 1200 include semiconductor structures 403, 404, 503, and 504 in FIGS. 4A, 4B, 5A, and 5B.

Figure 12B:
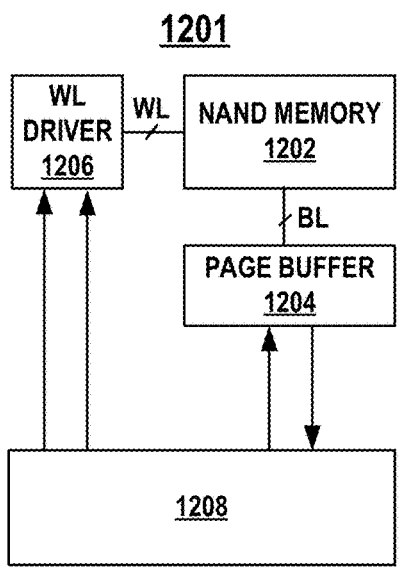
FIG. 12B illustrates a block diagram of an exemplary semiconductor structure having NAND memory and peripheral circuits, according to some embodiments.
Figure 12C:
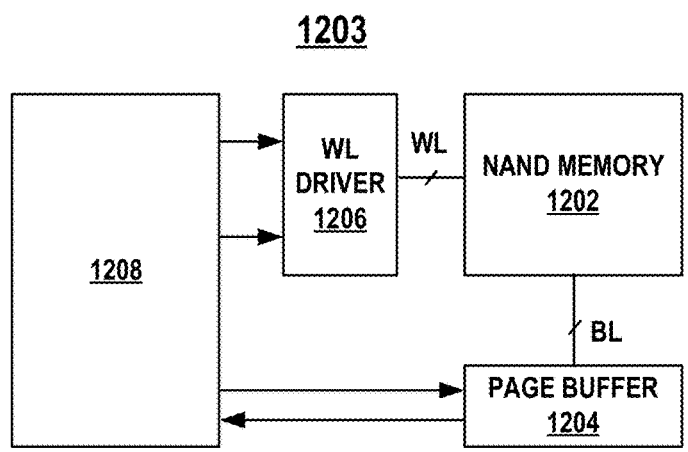
FIG. 12C illustrates a block diagram of another exemplary semiconductor structure having NAND memory and peripheral circuits, according to some embodiments.

FIG. 12B illustrates a block diagram of an exemplary semiconductor structure 1201 having NAND memory and peripheral circuits, according to some embodiments. FIG. 12C illustrates a block diagram of another exemplary semiconductor structure 1203 having NAND memory and peripheral circuits, according to some embodiments. Semiconductor structures 1201 and 1203 each includes NAND memory 1202 and the peripheral circuits thereof, for example, including page buffers 1204 electrically connected through bit lines, word line drivers 1206 electrically connected through word lines, and other peripheral circuits 1208 (e.g., sense amplifiers, address decoders, etc.). The peripheral circuits of NAND memory 1202 can be formed in the same semiconductor structure as NAND memory 1202, i.e., both in semiconductor structure 1201 or 1203. Other peripheral circuits 1208 can exchange data, control, and state signals with the programmable logic device in another semiconductor structure using a large number of short-distanced bonding contacts across the bonding interface as disclosed above in detail. Examples of semiconductor structures 1201 and 1203 include semiconductor structures 1100 and 1101 in FIGS. 11A and 11B.

Figure 15:
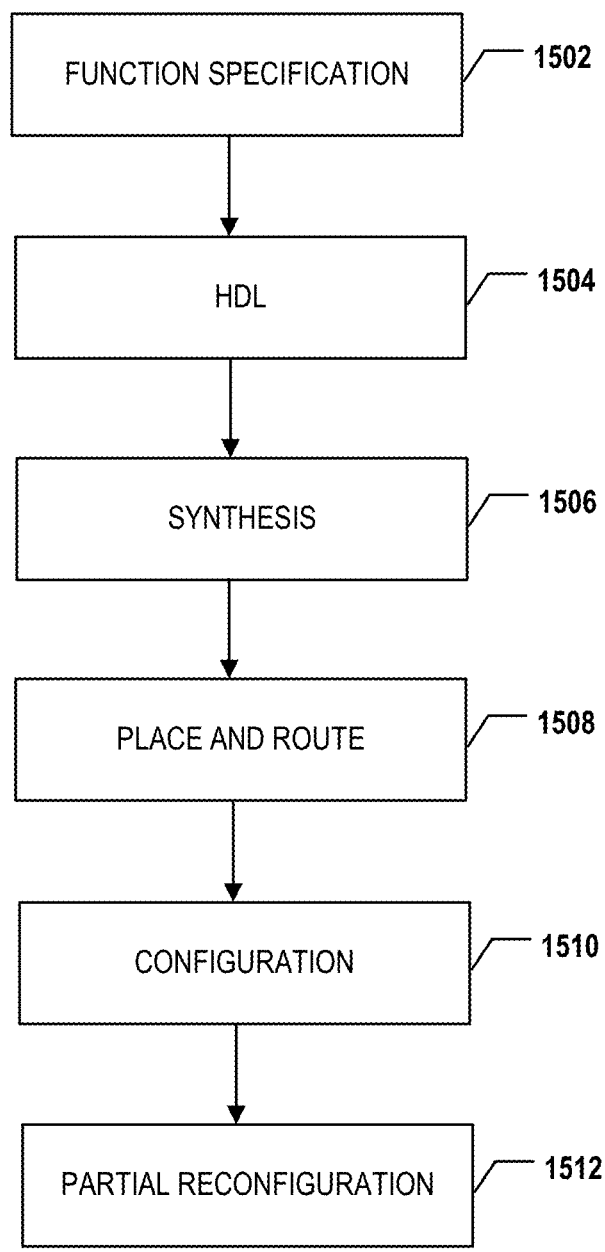
FIG. 15 is a flowchart of an exemplary method for programming a semiconductor device having a programmable logic device and SRAM, according to some embodiments.

As described above, the semiconductor device having a programmable logic device fabricated according to method 1300 or method 1400 has an undefined function at the time of manufacture and needs to be programmed after the manufacturing to perform its desired functions, according to some embodiments. For example, FIG. 15 is a flowchart of an exemplary method 1500 for programming a semiconductor device having a programmable logic device, according to some embodiments. The semiconductor device described in FIG. 15 can be any semiconductor device described herein including, for example, semiconductor devices 400, 401, 500, 501 depicted in FIGS. 4A, 4B, 5A, and 5B, respectively.

Referring to FIG. 15, method 1500 starts at operation 1502, in which the functions to be performed by the semiconductor device having a programmable logic device, e.g., FPGA, are specified. For example, the I/O interfaces, function behaviors and/or modules at different levels and internal interfaces thereof, and system clock may be defined as a function specification at this stage. Method 1500 proceeds to operation 1504, as illustrated in FIG. 15, in which the function specification is provided in the forms of HDLs, such as VHDL or Verilog. For example, the register-transfer level (RTL) description in the HDLs may be created and simulated. Method 1500 proceeds to operation 1506, as illustrated in FIG. 15, in which the design specified in the HDLs is synthesized. For example, bitstreams/netlist for the programmable logic device may be generated by the logic synthesis process, which turns the abstract specification of desired function behaviors, for example at RTL, into the design at the logic blocks levels. Method 1500 proceeds to operation 1508, as illustrated in FIG. 15, in which the logic blocks are placed and routed (interconnected) on the grid of the programmable logic device. For example, an automated place-and-route procedure may be performed to generate a pinout based on the netlist, which will be used to interface with the parts outside of the programmable logic device. Operations 1502, 1504, 1506, and 1508 can be performed by electronic design automation (EDA) tools.

Method 1500 proceeds to operation 1510, as illustrated in FIG. 15, in which the semiconductor device having a programmable logic device is configured. For example, once the design and validation processes are complete, the binary file generated, for example, using the FPGA vendor's proprietary software, may be used to configure the programmable logic device. In one example, this file in the format of bitstreams is transferred/downloaded into the FPGA via an interface, e.g., a serial interface (JTAG), or to the memory devices, e.g., the SRAM and/or NAND memory, in the semiconductor device. It is understood that in some embodiments, method 1500 may proceed to operation 1512, as illustrated in FIG. 15, in which the semiconductor device having a programmable logic device may be partially reconfigured in a dynamic manner while the remaining programmable logic device design continues to function. For example, a subset of the programmable logic blocks in an operating FPGA design may be reconfigured by downloading a partial bitstream into the FPGA in the semiconductor device. Partial Reconfiguration can allow for the dynamic change of function modules within an active FPGA design.

According to one aspect of the present disclosure, a semiconductor device includes a first semiconductor structure including a programmable logic device, an array of SRAM cells, and a first bonding layer including a plurality of first bonding contacts. The semiconductor device also includes a second semiconductor structure including an array of NAND memory cells and a second bonding layer including a plurality of second bonding contacts. The semiconductor device further includes a bonding interface between the first bonding layer and the second bonding layer. The first bonding contacts are in contact with the second bonding contacts at the bonding interface.

In some embodiments, the first semiconductor structure includes a substrate, the programmable logic device on the substrate, the array of SRAM cells on the substrate and outside of the programmable logic device, and the first bonding layer above the programmable logic device and the array of SRAM cells.

In some embodiments, the second semiconductor structure includes the second bonding layer above the first bonding layer, a memory stack above the second bonding layer, an array of 3D NAND memory strings extending vertically through the memory stack, and a semiconductor layer above and in contact with the array of 3D NAND memory strings.

In some embodiments, the second semiconductor structure includes the second bonding layer above the first bonding layer, an array of two-dimensional (2D) NAND memory cells above the second bonding layer, and a semiconductor layer above and in contact with the array of 2D NAND memory cells.

In some embodiments, the semiconductor device further includes a pad-out interconnect layer above the semiconductor layer. In some embodiments, the semiconductor layer includes polysilicon. In some embodiments, the semiconductor layer includes single-crystal silicon.

In some embodiments, the second semiconductor structure includes a substrate, a memory stack above the substrate, an array of 3D NAND memory strings extending vertically through the memory stack, and the second bonding layer above the array of 3D NAND memory strings.

In some embodiments, the second semiconductor structure includes a substrate, an array of 2D NAND memory cells on the substrate, and the second bonding layer above the array of 2D NAND memory cells.

In some embodiments, the first semiconductor structure includes the first bonding layer above the second bonding layer, the programmable logic device above the first bonding layer, the array of SRAM cells above the first bonding layer and outside of the programmable logic device, and a semiconductor layer above and in contact with the programmable logic device and the array of SRAM cells.

In some embodiments, the semiconductor device further includes a pad-out interconnect layer above the semiconductor layer. In some embodiments, the semiconductor layer includes single-crystal silicon.

In some embodiments, the first semiconductor structure further includes a peripheral circuit of the array of NAND memory cells. In some embodiments, the second semiconductor structure further includes a peripheral circuit of the array of NAND memory cells.

In some embodiments, the peripheral circuit is above or below the array of NAND memory cells. In some embodiments, the peripheral circuit is outside of the array of NAND memory cells.

In some embodiments, the first semiconductor structure includes a first interconnect layer vertically between the first bonding layer and the programmable logic device, and the second semiconductor structure includes a second interconnect layer vertically between the second bonding layer and the array of NAND memory cells.

In some embodiments, the programmable logic device is electrically connected to the array of NAND memory cells through the first and second interconnect layers and the first and second bonding contacts.

In some embodiments, the array of SRAM cells are electrically connected to the array of NAND memory cells through the first and second interconnect layers and the first and second bonding contacts.

In some embodiments, the programmable logic device includes a plurality of programmable logic blocks.

According to another aspect of the present disclosure, a method for forming a semiconductor device is disclosed. A plurality of first semiconductor structures are formed on a first wafer. At least one of the first semiconductor structures includes a programmable logic device, an array of SRAM cells, and a first bonding layer including a plurality of first bonding contacts. A plurality of second semiconductor structures are formed on a second wafer. At least one of the second semiconductor structures includes an array of NAND memory cells and a second bonding layer including a plurality of second bonding contacts. The first wafer and the second wafer are bonded in a face-to-face manner, such that the at least one of the first semiconductor structures is bonded to the at least one of the second semiconductor structures. The first bonding contacts of the first semiconductor structure are in contact with the second bonding contacts of the second semiconductor structure at a bonding interface. The bonded first and second wafers are diced into a plurality of dies. At least one of the dies includes the bonded first and second semiconductor structures.

In some embodiments, to form the plurality of first semiconductor structures, the programmable logic device and the array of SRAM cells are formed on the first wafer, a first interconnect layer is formed above the programmable logic device and the array of SRAM cells, and the first bonding layer is formed above the first interconnect layer. In some embodiments, to form the programmable logic device and the array of SRAM cells, a plurality of transistors are formed on the first wafer.

In some embodiments, to form the plurality of first semiconductor structures, a peripheral circuit of the array of NAND memory cells is formed on the first wafer.

In some embodiments, to form the plurality of second semiconductor structures, a memory stack is formed above the second wafer, an array of 3D NAND memory strings extending vertically through the memory stack are formed, a second interconnect layer is formed above the array of NAND memory strings, and the second bonding layer is formed above the second interconnect layer.

In some embodiments, to form the plurality of second semiconductor structures, an array of 2D NAND memory cells are formed on the second wafer, a second interconnect layer is formed above the array of NAND memory strings, and the second bonding layer is formed above the second interconnect layer.

In some embodiments, to form the plurality of second semiconductor structures, a peripheral circuit of the array of NAND memory cells is formed on the second wafer.

In some embodiments, the peripheral circuit is formed above or below the array of NAND memory cells. In some embodiments, the peripheral circuit is formed outside of the array of NAND memory cells.

In some embodiments, the second semiconductor structure is above the first semiconductor structure after the bonding. In some embodiments, after the bonding and prior to the dicing, the second wafer is thinned to form a semiconductor layer, and a pad-out interconnect layer is formed above the semiconductor layer.

In some embodiments, the first semiconductor structure is above the second semiconductor structure after the bonding. In some embodiments, after the bonding and prior to the dicing, the first wafer is thinned to form a semiconductor layer, and a pad-out interconnect layer is formed above the semiconductor layer.

In some embodiments, the bonding includes hybrid bonding.

According to still another aspect of the present disclosure, a method for forming a semiconductor device is disclosed. A plurality of first semiconductor structures are formed on a first wafer. At least one of the first semiconductor structures includes a programmable logic device, an array of SRAM cells, and a first bonding layer including a plurality of first bonding contacts. The first wafer is diced into a plurality of first dies, such that at least one of the first dies includes the at least one of the first semiconductor structures. A plurality of second semiconductor structures are formed on a second wafer. At least one of the second semiconductor structures includes an array of NAND memory cells and a second bonding layer including a plurality of second bonding contacts. The second wafer is diced into a plurality of second dies, such that at least one of the second dies includes the at least one of the second semiconductor structures. The first die and the second die are bonded in a face-to-face manner, such that the first semiconductor structure is bonded to the second semiconductor structure. The first bonding contacts of the first semiconductor structure are in contact with the second bonding contacts of the second semiconductor structure at a bonding interface.

In some embodiments, to form the plurality of first semiconductor structures, the programmable logic device and the array of SRAM cells are formed on the first wafer, a first interconnect layer is formed above the programmable logic device and the array of SRAM cells, and the first bonding layer is formed above the first interconnect layer. In some embodiments, to form the programmable logic device and the array of SRAM cells, a plurality of transistors are formed on the first wafer.

In some embodiments, to form the plurality of first semiconductor structures, a peripheral circuit of the array of NAND memory cells is formed on the first wafer.

In some embodiments, to form the plurality of second semiconductor structures, a memory stack is formed above the second wafer, an array of 3D NAND memory strings extending vertically through the memory stack are formed, a second interconnect layer is formed above the array of 3D NAND memory strings, and the second bonding layer is formed above the second interconnect layer.

In some embodiments, to form the plurality of second semiconductor structures, an array of 2D NAND memory cells are formed on the second wafer, a second interconnect layer is formed above the array of 2D NAND memory cells, and the second bonding layer is formed above the second interconnect layer.

In some embodiments, to form the plurality of second semiconductor structures, a peripheral circuit of the array of NAND memory cells is formed on the second wafer.

In some embodiments, the peripheral circuit is formed above or below the array of NAND memory cells. In some embodiments, the peripheral circuit is formed outside of the array of NAND memory cells.

In some embodiments, the second semiconductor structure is above the first semiconductor structure after the bonding. In some embodiments, the second wafer is thinned to form a semiconductor layer prior to the dicing of the second wafer, and a pad-out interconnect layer is formed above the semiconductor layer.

In some embodiments, the first semiconductor structure is above the second semiconductor structure after the bonding. In some embodiments, the first wafer is thinned to form a semiconductor layer prior to the dicing of the first wafer, and a pad-out interconnect layer is formed above the semiconductor layer.

In some embodiments, the bonding includes hybrid bonding.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A semiconductor device, comprising:
a first semiconductor structure comprising, a substrate, a programmable logic device, an array of static random-access memory (SRAM) cells, and a first bonding layer comprising a plurality of first bonding contacts, wherein the programmable logic device is disposed on the substrate, and the array of SRAM cells are integrated on the same substrate and surrounding the programmable logic device in a same plane;
a second semiconductor structure comprising an array of NAND memory cells and a second bonding layer comprising a plurality of second bonding contacts; and
a bonding interface between the first bonding layer and the second bonding layer, wherein the first bonding contacts are in contact with the second bonding contacts at the bonding interface.

2. The semiconductor device of claim 1, wherein
the first bonding layer is disposed above the programmable logic device and the array of SRAM cells.

3. The semiconductor device of claim 2, wherein
the second bonding layer is disposed above the first bonding layer;
the array of NAND memory cells comprise a memory stack above the second bonding layer and an array of three-dimensional (3D) NAND memory strings extending vertically through the memory stack; and
the second semiconductor structure further comprises a semiconductor layer above and in contact with the array of 3D NAND memory strings.

4. The semiconductor device of claim 2, wherein
the second bonding layer is disposed above the first bonding layer;
the array of NAND memory cells comprise an array of two-dimensional (2D) NAND memory cells above the second bonding layer; and
the second semiconductor structure further comprises a semiconductor layer above and in contact with the array of 2D NAND memory cells.

5. The semiconductor device of claim 3, further comprising a pad-out interconnect layer above the semiconductor layer, wherein the semiconductor layer comprises polysilicon or single-crystal silicon.

6. The semiconductor device of claim 1, wherein the first semiconductor structure or the second semiconductor structure further comprises a peripheral circuit of the array of NAND memory cells.

7. The semiconductor device of claim 1, wherein
the first semiconductor structure further comprises a first interconnect layer vertically between the first bonding layer and the programmable logic device, and the second semiconductor structure further comprises a second interconnect layer vertically between the second bonding layer and the array of NAND memory cells; and
the programmable logic device and the array of SRAM cells are electrically connected to the array of NAND memory cells through the first and second interconnect layers and the first and second bonding contacts.

8. The semiconductor device of claim 1, wherein the programmable logic device comprises a plurality of programmable logic blocks.

9. The semiconductor device of claim 3, wherein the semiconductor layer comprises single-crystal silicon.

10. The semiconductor device of claim 6, wherein the peripheral circuit is disposed outside of the array of NAND memory cells.

11. A semiconductor device, comprising:
a first semiconductor structure comprising a programmable logic device, an array of static random-access memory (SRAM) cells, and a first bonding layer comprising a plurality of first bonding contacts, wherein the array of SRAM cells and the programming logic device are disposed on a same plane over the first bonding layer;
a second semiconductor structure disposed under the first semiconductor structure and comprising a substrate, an array of NAND memory cells above the substrate, and a second bonding layer comprising a plurality of second bonding contacts; and
a bonding interface between the first bonding layer and the second bonding layer, wherein the first bonding contacts are in contact with the second bonding contacts at the bonding interface.

12. The semiconductor device of claim 11, wherein
the array of NAND memory cells comprises a memory stack and an array of 3D NAND memory strings extending vertically through the memory stack; and
the second bonding layer is disposed above the memory stack and the array of 3D NAND memory strings.

13. The semiconductor device of claim 11, wherein
the array of NAND memory cells comprises an array of 2D NAND memory cells; and
the second bonding layer is disposed above the array of 2D NAND memory cells.

14. The semiconductor device of claim 11, wherein the first bonding layer is disposed above the second bonding layer.

15. The semiconductor device of claim 11, wherein the first semiconductor structure further comprises a semiconductor layer above and in contact with the programmable logic device and the array of static random-access memory (SRAM) cells.

16. The semiconductor device of claim 11, wherein the first semiconductor structure or the second semiconductor structure further comprises a peripheral circuit of the array of NAND memory cells.

17. The semiconductor device of claim 16, wherein the peripheral circuit is disposed outside of the array of NAND memory cells.

18. The semiconductor device of claim 11, wherein the first semiconductor structure further comprises a first interconnect layer vertically between the first bonding layer and the programmable logic device, and the second semiconductor structure further comprises a second interconnect layer vertically between the second bonding layer and the array of NAND memory cells.

19. The semiconductor device of claim 18, wherein the programmable logic device is electrically connected to the array of NAND memory cells through the first and second interconnect layers and the first and second bonding contacts.

20. The semiconductor device of claim 18, wherein the array of SRAM cells are electrically connected to the array of NAND memory cells through the first and second interconnect layers and the first and second bonding contacts.

* * * * *